United States Patent [19]
Ota et al.

[11] Patent Number: 5,185,722
[45] Date of Patent: Feb. 9, 1993

[54] SEMICONDUCTOR MEMORY DEVICE HAVING A MEMORY TEST CIRCUIT

[75] Inventors: Yoshiji Ota, Nara; Kazuaki Ochiai, Tenri, both of Japan

[73] Assignee: Sharp Kabushiki Kaisha, Japan

[21] Appl. No.: 616,923

[22] Filed: Nov. 21, 1990

[30] Foreign Application Priority Data

| Nov. 22, 1989 | [JP] | Japan | 1-333739 |
| Nov. 24, 1989 | [JP] | Japan | 1-304983 |
| Feb. 13, 1990 | [JP] | Japan | 2-31818 |
| Mar. 9, 1990 | [JP] | Japan | 2-59515 |
| May 29, 1990 | [JP] | Japan | 2-139127 |
| Aug. 6, 1990 | [JP] | Japan | 2-208722 |
| Sep. 14, 1990 | [JP] | Japan | 2-244564 |

[51] Int. Cl.$^5$ .............................................. G11C 7/00
[52] U.S. Cl. .................. 365/201; 365/189.04; 365/210; 371/21.1
[58] Field of Search .............. 385/201, 189.04, 210; 371/21.1, 25.1, 10.1, 67.1, 68.1

[56] References Cited

U.S. PATENT DOCUMENTS

| 4,414,665 | 11/1983 | Kimura et al. | 365/201 X |
| 4,672,582 | 6/1987 | Nishimura et al. | 365/201 |
| 4,792,922 | 12/1988 | Mimoto et al. | 365/149 |
| 4,821,238 | 4/1989 | Tatematsu | 365/201 |
| 5,022,007 | 6/1991 | Arimoto et al. | 365/201 |
| 5,023,840 | 6/1991 | Tobita | 365/201 |
| 5,051,995 | 9/1991 | Tobita | 371/21.1 |
| 5,091,888 | 2/1992 | Akaogi | 365/201 |

OTHER PUBLICATIONS

Excerpt of a lecture entitled "Parallel Testing Technology for ULSI Memories" made in a National Spring Meeting held by The Institute of Electronics, Information and Communication Engineers, 1989, Spring.

Primary Examiner—Eugene R. LaRoche
Assistant Examiner—Son Dinh
Attorney, Agent, or Firm—Nixon & Vanderhye

[57] ABSTRACT

A semiconductor memory device has an array of examined memory cells, and reference memory cells in a column. The examined memory cells in each column and the reference memory cells are connected with respective pairs of complementary bit lines connected with sense amplifiers. Each reference memory cell and the examined memory cells in each row are connected with corresponding word lines. The device also has a line data memory circuit, a bit line select circuit and a plurality of output evaluation circuits connected with the bit line pairs for the examined memory cells. In a test mode, identical data is simultaneously written to the reference and examined memory cells connected with each word line. The line data memory circuit outputs data from the reference memory cell as expected data, in response to which, the bit line select circuit selects one of the bit lines for each of the examined memory cells when the expected data is LOW, and the other of the bit lines when the expected data is HIGH. Each output evaluation circuit simultaneously detects an output from a corresponding examined memory cell via the one bit line or the other bit line selected in accordance with the expected data, and outputs a signal indicating coincidence or non-coincidence between the output signal detected and the expected value. Thus the device tests its own operation through a parallel access to the memory cells.

11 Claims, 18 Drawing Sheets

SEMICONDUCTOR MEMORY DEVICE HAVING A MEMORY TEST CIRCUIT

BACKGROUND OF THE INVENTION

The present invention relates to a semiconductor memory device which can execute an operating test at a high speed.

This application is related to the commonly assigned copening application of Ohta entitled "Semiconductor Memory Device", filed Nov. 14, 1990 and assigned Ser. No. 07/612,503 pending.

Recent advances in semiconductor memory devices have been rapid, with the degree of integration of random access memories (RAMs), read-only memories (ROMs), and other memory devices quadrupling every three years. As the degree of integration has increased, the time required to execute an operating test has also increased, thus increasing the need for a high speed test mode enabling more efficient pre-shipment testing by the manufacturer and receival testing by the user.

Reflecting these requirements, a test method called a multi-bit test method has been used. This method reads test data from two memory cells at a time and compares data read from one memory cell with that read from the other memory cell. When the data read from both memory cells are coincident, data reading is regarded as normally executed. This method realizes a speedy test, as compared with a method by which data is read from each one of the memory cells and checked. Still, it cannot be said that the multi-bit test method satisfies the above requirements. In addition, if the data reading from two memory cells are both in error, those data become coincident and therefore misjudged as normally read.

SUMMARY OF THE INVENTION

Therefore, a main object of the present invention is to provide a semiconductor memory device which can execute an operating test at a higher speed by testing one line equivalent (in practice, 1024 bits or 2048 bits) in parallel.

Another object of the present invention is to provide a semiconductor memory device which is not affected by defective bit lines, if any, in performing an operating test.

A further object of the present invention is to provide a semiconductor memory device which can cut off defective bit lines, when found.

A semiconductor memory device according to the present invention has a plurality of examined memory cells for storing data to be tested in a test mode of the device, said plurality of examined memory cells being arranged in rows and columns; a plurality of reference memory cells in a column for storing expected data in the test mode; a plurality of word lines which are connected with the examined memory cells in respective rows and respective ones of said plurality of reference memory cells; a plurality of pairs of bit lines operating complementarily, connected with the examined memory cells in respective columns; a pair of bit lines operating complementarily, connected with said plurality of reference memory cells in a single column; a plurality of sense amplifiers connected with respective pairs of bit lines connected with the examined memory cells and the reference memory cells for amplifying data on the bit lines before the data are outputted; a line data memory circuit for outputting the expected data written to a reference memory cell via the pair of bit lines connected to the reference memory cell; a bit line select circuit for selecting, in response to the expected data, one of the bit lines for each of the examined memory cells when the expected data is of a low level, and selecting the other of the bit lines when the expected data is of a high level; a plurality of output evaluation circuits connected with respective ones of the pairs of bit lines for the examined memory cells, each output evaluation circuit detecting via the one bit line selected by the bit line select circuit when the expected data is of a low level, an output signal from the corresponding examined memory cell which expresses data having been written to the examined memory cell in parallel to the reference memory cell and which ought to have a value identical with the expected data; and detecting the output signal via the other bit line selected by the bit line select circuit when the expected data is of a high level; and outputting a signal indicative of coincidence or non-coincidence between the output signal detected and the expected data.

The device with the above structure operates as follows.

In a parallel test mode, identical data having a logical value of 1 or 0 is written to the reference memory cell and the examined memory cells.

When the data written to the reference memory cell has a logical value of 1, the expected data outputted by the line data memory circuit has a HIGH level. At this time, each of the output evaluation circuits for the examined memory cells detects the output signal expressing data which has been written to the corresponding examined memory cells and which should be identical to the expected data, via one bit line selected by the bit line selection circuit. The one bit line for each of the examined memory cells has a level either HIGH or LOW expressing the output signal. Each output evaluation circuit outputs a signal expressing the coincidence or non-coincidence of the output signal and the expected data according to whether the detected level of the output signal is HIGH or LOW.

On the other hand, if the data written to the reference memory cell has a logical value of 0, the expected data outputted by the line data memory circuit has a LOW level. At this time, each of the output evaluation circuits for the examined memory cells detects the output signal from the corresponding examined memory cell via the other bit line selected by the bit line selection circuit.

For example, in the case that the one bit line of each of the examined memory cells is designed to have a LOW level when the written data is a logical 1 and the data is normally read from the memory cells, if a detected level of the one bit line of a memory cell is actually LOW (at this time the other bit line is HIGH), the corresponding output evaluation circuit outputs a signal indicating coincidence, but outputs a signal indicating non-coincidence when the detected level is actually HIGH. On the other hand, when the written data is a logical 0, the data on the other bit line is read. If reading of the data is normally executed, the other bit line will have a LOW level. Thus, the output evaluation circuit outputs a signal indicating coincidence when the detected level is LOW, namely when reading is executed normally, but outputs a signal indicating non-coincidence when the detected level is HIGH, that is, there is a read error.

Thus, whether the identical data written simultaneously to the examined memory cells and the reference memory cell has a logical value of 0 or 1, the output evaluation circuits output a signal indicating coincidence when reading from the examined memory cells is executed normally, and output a signal indicating non-coincidence when there is a read error from the examined memory cells.

In the above operation, a simultaneous selection of the memory cells for one-line data is made in general through an operation of one word line. In addition, the output evaluation circuits connected with the examined memory cells are operated simultaneously but independently of each other. As a result, the examined memory cells for one-line data can be simultaneously tested. An operating test can therefore be executed at high speed.

According to another embodiment of the present invention, each output evaluation circuit has a fuse for separating the pair of bit lines connected with the output evaluation circuit from an output terminal of the output evaluation circuit when the output evaluation circuit outputs a signal expressing the non-coincidence.

In this case, if there is a read error in an examined memory cell, bit lines connected with the examined memory cell are separated from an output terminal of the corresponding output evaluation circuit by cutting the fuse. Thereby, the memory cell is stopped from outputting its data. Therefore, even if defective bit lines or examined memory cells exist, the operating test can be carried out without being affected by such defective bit lines or examined memory cells.

According to another embodiment of the present invention, a fuse is provided between each sense amplifier and a drive signal line for transferring a drive signal for the sense amplifiers.

In this case, if there is an error in reading data from an examined memory cell, the fuse between the drive signal line and a corresponding sense amplifier having amplified a signal from the examined memory cell is cut. Then, the sense amplifier becomes inoperative and a pair of bit lines (defective bit lines) connected to the sense amplifier will not operate any more. Accordingly, even if there are defective bit lines or memory cells in the semiconductor memory device, data readout and evaluation operations are not affected by the defective bit lines or memory cells.

According to a further embodiment of the present invention, the output evaluation circuits each have a transistor controlled to be turned on or off by a corresponding one of a plurality of control circuits, instead of a fuse, so as for the corresponding pair of bit lines to be electrically connected with or separated from the output terminal of the output evaluation circuit. The control circuits are operatively connected with the output evaluation circuits respectively such that the control circuits turn on the transistors when the output evaluation circuits output the signal indicative of coincidence and turn off the transistors when the output evaluation circuits output the signal indicative of non-coincidence. The transistor of each output evaluation circuit is controlled individually and independently of the transistors of the other output evaluation circuits.

In this case, if there are any defective bit lines connected to defective examined memory cells, the defective bit lines and the output terminals of the corresponding output evaluation circuits are electrically separated from each other by turning off the transistors. Accordingly, data readout and evaluation operations are not affected by the defective bit lines in this case as well.

According to a still further embodiment of the present invention, the sense amplifiers each have a transistor controlled to be turned on or off by a corresponding one of a plurality of control circuits so as for the sense amplifiers to be electrically connected with or separated from a drive signal line carrying a signal for driving the sense amplifiers, said control circuits are operatively connected with the output evaluation circuits respectively such that the control circuits turn on the transistors when the output evaluation circuits output the signal indicative of coincidence and turn off the transistors when the output evaluation circuits output the signal indicative of non-coincidence, the transistor of each sense amplifier being controlled individually and independently of the transistors of the other sense amplifiers.

With this structure, if there is an error in reading data from an examined memory cell, a transistor between the drive signal line and a sense amplifier having amplified a signal indicative of the data in the examined memory cell in question is turned off. This makes the sense amplifier inoperative and the bit lines connected to the sense amplifiers will not further operate. For this reason, even if the semiconductor memory device has defective examined memory cells or bit lines, the read readout and evaluation operations will not affected by such defective memory cells or bit lines.

According to a still further embodiment of the present invention, the semiconductor memory device outputs a pass signal only when all the output evaluation circuits output the signal indicative of coincidence, and outputs a fail signal when all the output evaluation circuits do not output the signal indicative of coincidence. Furthermore, the memory device has a row address counter for receiving a count input signal in response to a line test signal for instructing to start a test of the device to count a row address to be tested and output the counted row address deciding a word line to a row decoder; an input terminal for inputting a plurality of test patterns from an external source; a latch circuit for latching the test patterns inputted from the input terminal in response to the line test signal; and a pattern control circuit for selecting in response to a signal outputted by the row address counter one of the test patterns latched by the latch circuit and outputting the selected test pattern to the line data storage circuit as input data to be written to the reference memory cells and the examined memory cells.

According to this embodiment, the row address counter receives the count input signal, counts the row address, and outputs the counted row address. The latch circuit latches the plurality of test patterns inputted from the input terminal. The pattern control circuit selects one of the test patterns latched by the latch circuit based on the signal outputted by the row address counter, and inputs the selected test pattern to the line data storage circuit as the input data to be written to the memory cells.

Thus, by inputting a signal which automatically increments the row address counter as the count input signal, a word line to be tested can be automatically selected. Furthermore, because the input data to the line storage circuit is selected from the multiple line patterns latched by the latch circuit in response to the signal outputted by the row address counter, it is not necessary to provide such input data from an external source at each test operation. The test can therefore be completed simply, and the test time is reduced.

A memory test circuit for a semiconductor memory device according to an embodiment of the present invention has a means for generating an expected value of either high or low level, an output signal line for temporarily holding the expected value; a fail signal line for constantly holding a level in reverse phase to the output signal line; a first data line carrying a first data signal of a level which should be identical to that of the expected value; a second data line carrying a second data signal which is a complementary signal of the first data signal; a data signal select circuit for, in response to the expected value from the generating means, generating a data select signal designating either the first data signal or the second data signal based on the expected value; a first switch for selecting and outputting one of the complementary first and second data signals in response to the data select signal generated by the data signal select circuit; a second switch provided between the output signal line and the fail signal line so that in response to an output signal from the first switch the second switch electrically connects the output signal line with or separates the output signal line from the fail signal line in accordance with a level of the output signal.

In this embodiment, whenever the level of the first data signal is coincident with the level of the expected value, the output signal from the first switch allows the second switch to separate the output signal line from the fail signal line so that the output signal line outputs the expected value temporarily held by the output signal line. On the other hand, whenever the level of the first data signal is not coincident with the level of the expected value, the output signal from the first switch causes the second switch to connect the output signal line with the fail signal line so that the output signal line outputs the level held by the fail signal line. Thus, a single bit is tested with a pair of data input signals. The operation of a semiconductor memory device can thus be tested without comparing input data signals from multiple bits, and each datum can be individually tested. By providing a plurality of sets of first and second switches, data signals from multiple bits can be each individually evaluated. Therefore, even when there is reading error in every bit, the error can be found.

Specifically, by providing the above first switches and second switches in a number equal to the number of data input terminals, and by precharging the output signal line with a pass signal and applying the data select signal to a data select signal terminal at the test, the pass signal will be outputted when all data are correct and a fail signal will be outputted when even only one datum is in error, and multiple data can thus be evaluated simultaneously.

In other words, when multiple first switches and second switches are provided and data from multiple data lines are simultaneously evaluated, the test time for a semiconductor memory device having multiple memory cells can be reduced, and an error can be detected even if all data evaluated at one time are in error.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First Embodiment

Figure 1:
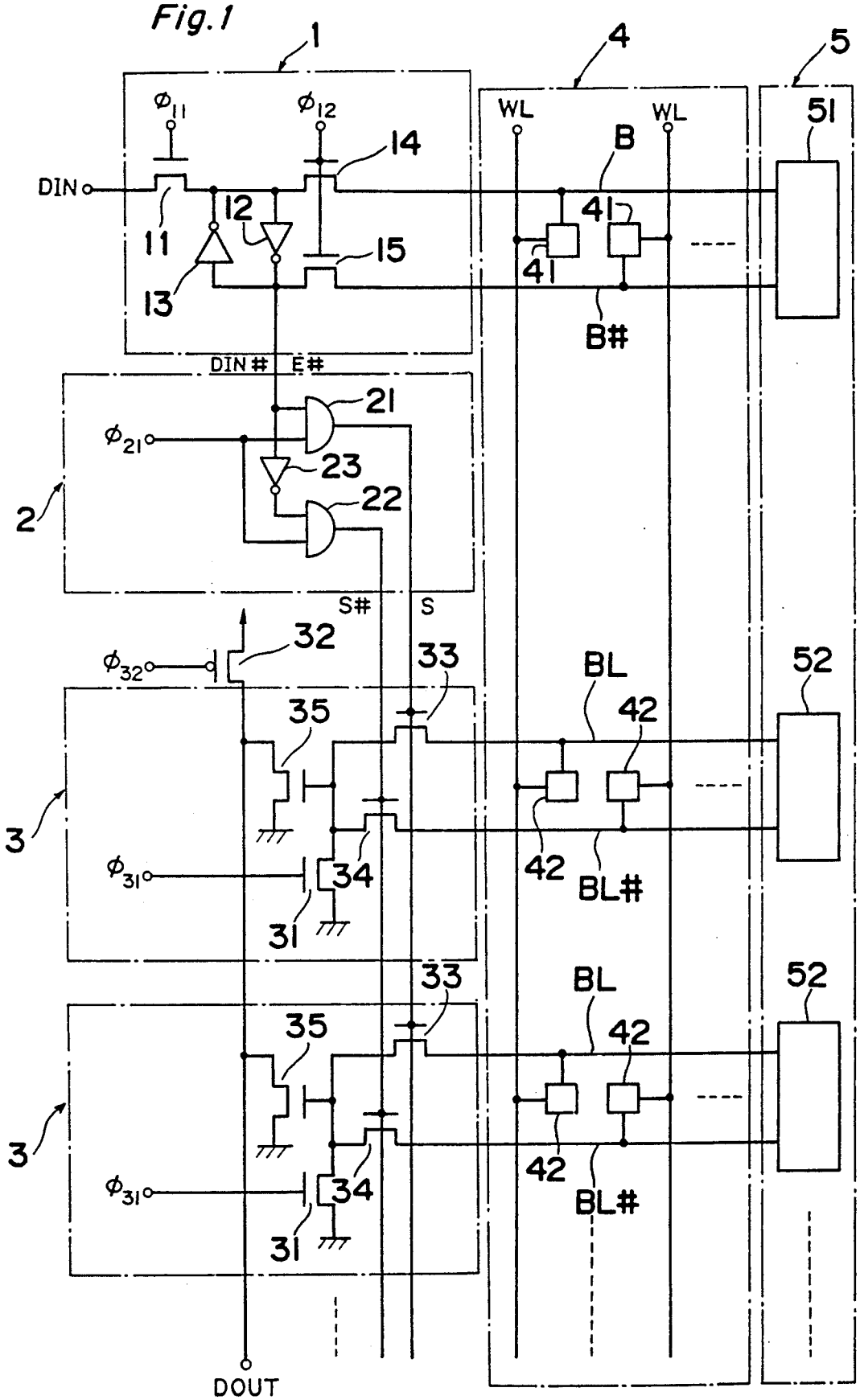
FIG. 1 is a circuit diagram of a DRAM according to a first embodiment of the present invention.
Figure 2:
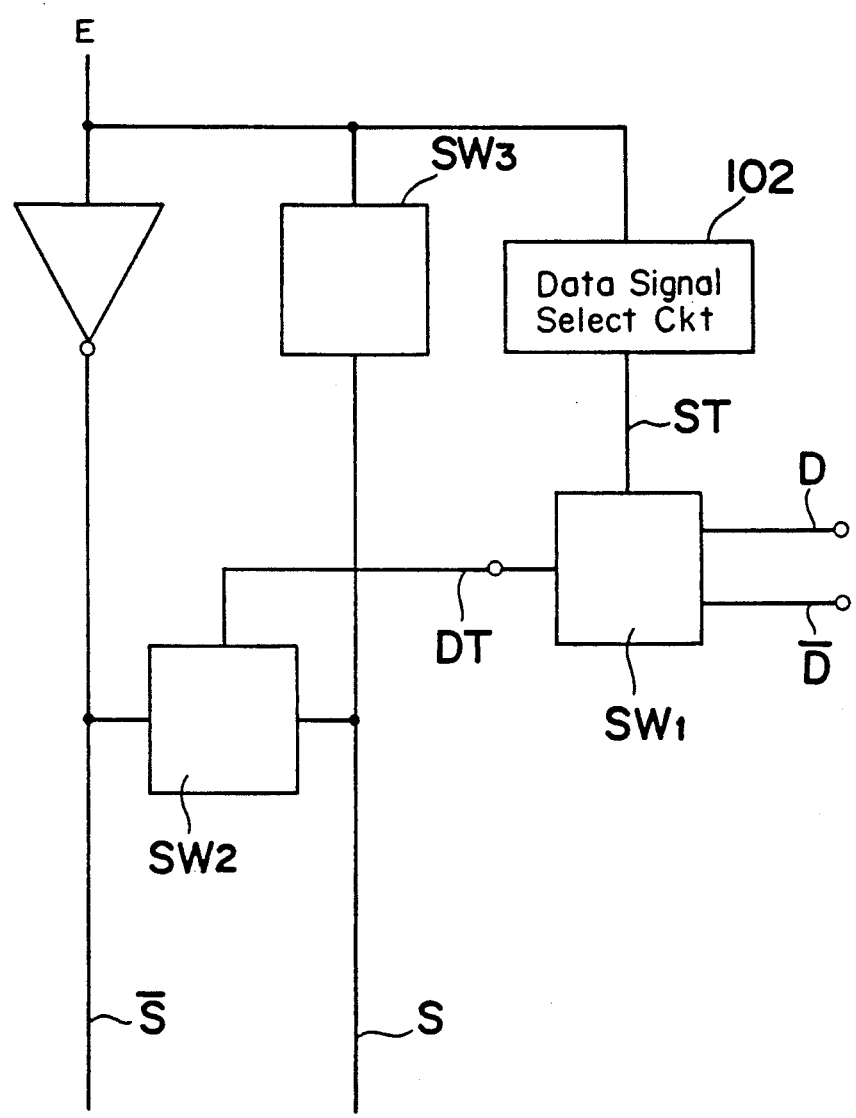
FIG. 2 is a block diagram of a test circuit in a semiconductor memory device according to a second embodiment of the present invention.

FIG. 1 shows a dynamic random access memory (DRAM) according to a first embodiment of the present invention. The DRAM has a line data storage circuit 1, a bit line select circuit 2 and a plurality of output evaluation circuits 3. A reference numeral 4 indicates a memory cell array including a plurality of memory cells 41, 42, 42, ... A reference numeral 5 indicates a sense amplifier array including a plurality of sense amplifiers 51, 52, 52, ... The memory cells 41, 42, 42, ... in each row are connected to word lines WL and are selected simultaneously by the respective word lines WL (only part of the memory cells and the word lines are shown in FIG. 1 for the sake of simplicity). The memory cell 41 on each word line is a reference memory cell specialized for a line test, namely, data in the reference memory cell 41 is used as reference data for comparison with data read from the examined memory cells 42. Data write to and data read from the reference memory cells 41 are carried out through a pair of complementarily operating bit lines B and B# while data write to and read from the other memory cells 42 are carried out by the other pairs of complementarily operating bit lines BL and BL#. The sense amplifiers 51 and 52 amplify the potential difference between the bit lines B and B# and that between the bit lines BL and BL#.

The line data storage circuit 1 has a n-channel metal oxide semiconductor (NMOS) transistor 11 controlled by a signal $\phi 11$, inverters 12 and 13 connected in parallel but in opposite directions, NMOS transistors 14 and 15 which are simultaneously controlled by a signal $\phi 12$. The line data storage circuit 1 writes data, which is an input signal DIN, to the memory cell 41, for example, through the bit lines B and B#. On the other hand, data DIN#, which is obtained by inverting the input signal DIN, is outputted from the line data storage circuit 1 to the bit line select circuit 2. Data written to the memory cell 41 is read out as an expected value signal E. After inverted, the signal E is outputted to the bit line select circuit 2 as signal E#.

The bit line selected circuit 2 has AND gates 21 and 22 to receive a signal $\phi 21$, and an inverter 23 connected between respective input terminals of the AND gates 21 and 22. In response to the inverted signal DIN# or the inverted expected value signal E# from the line data storage circuit 1, the bit line select circuit 2 outputs a pair of select signals S and S# for selecting the bit line BL or BL# for each memory cell 42 in accordance with the level of the signal DIN# or E#.

Each output evaluation circuit 3 has an NMOS transistor 35 connected between an output line DOUT and the ground, and NMOS transistors 33 and 34 respectively connected to the bit lines BL and BL#. A gate electrode of the NMOS transistor 35 is connected with the complementary bit lines BL and BL# through the NMOS transistors 33, 34, respectively. The NMOS transistors 33 and 34 are respectively controlled by the select signals S and S# outputted from the bit line select circuit 2. Each output evaluation circuit 3 also has an NMOS transistor 31 which is connected between the gate electrode of the NMOS transistor 35 and the ground and which is controlled by a signal $\phi 31$. A common p-channel metal oxide semiconductor (PMOS) transistor 32 is connected between a power source and the output line DOUT and is controlled to be turned on or off by a signal $\phi 32$.

Figure 22:
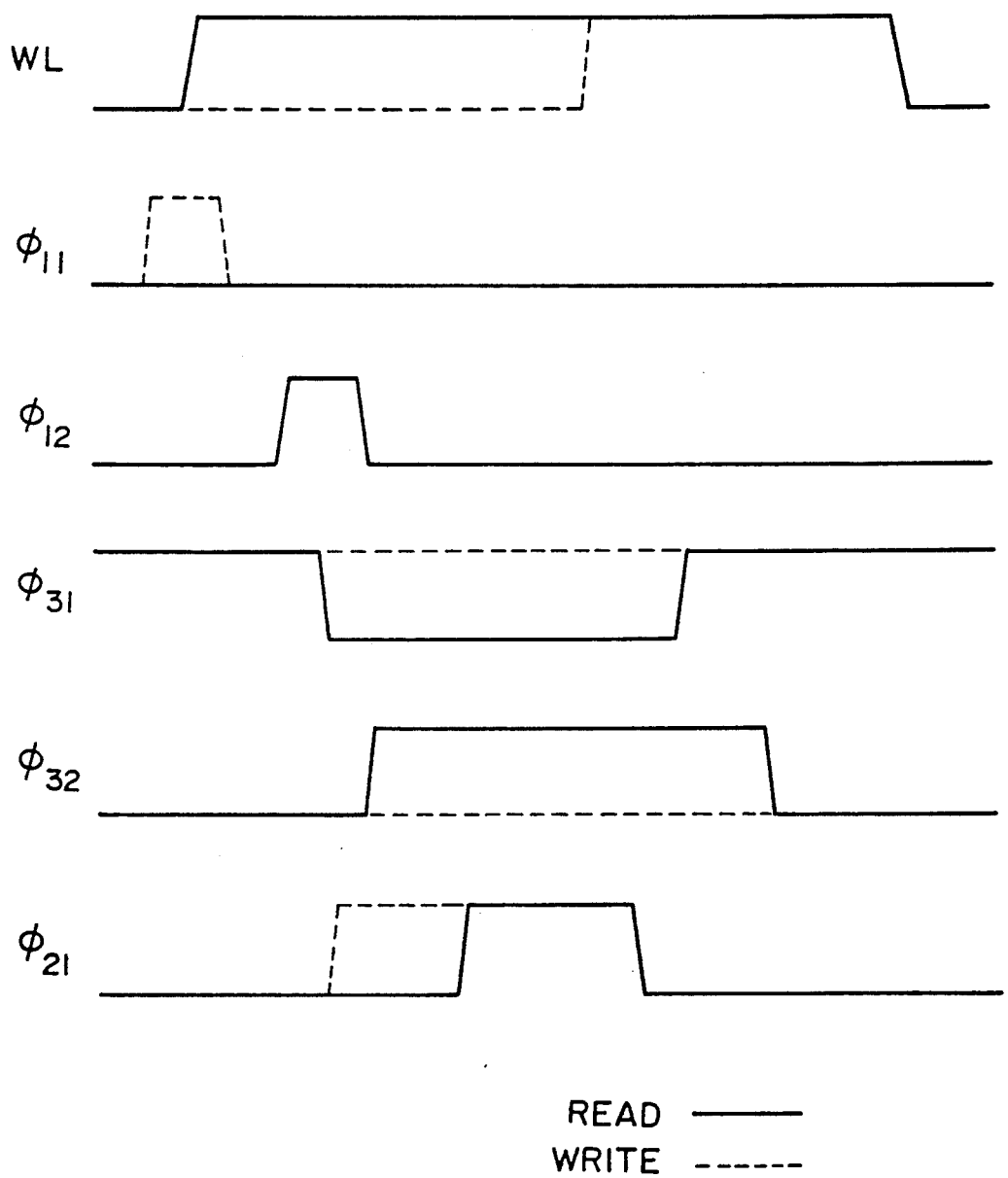
FIG. 22 is a timing chart for write and readout operations of the DRAMs of the above first, fourth, fifth, sixth and seventh embodiments.

The DRAM with the above structure acts as described below, based on the timing as shown in FIG. 22. In FIG. 22, a dotted line indicates timing for a write operation and a solid line indicates timing for a read operation.

The following describes the write operation.

In a precharge state (the left end of the timing chart in FIG. 22), the signal $\phi 21$ is at a LOW level, output signals from the AND gates 21 and 22 in the bit line select circuit 2 are both at a LOW level, and accordingly, no continuity exists in the NMOS transistors 33 and 34, that is, the NMOS transistors 33 and 34 are in an off-state. At this time, the signal $\phi 31$ is at a HIGH level and the signal $\phi 32$ is at a LOW level.

When the write operation starts, the level of the input signal DIN becomes HIGH or LOW in accordance with an input data. Then the signal $\phi 11$ rises, so that the NMOS transistor 11 in the line data storage circuit 1 is turned on. As a result, the input signal DIN is latched by the inverters 12 and 13. After that, the signal $\phi 21$ rises. At this time, if the input signal DIN is at a HIGH level, that is, the inverted signal DIN# is at a LOW level, the voltage level of the select signal S becomes LOW and that of the other select signal S# becomes HIGH. As a result, the NMOS transistor 34 is turned on, so that the bit line BL# is dropped to the ground (GND) level. On the other hand, because the NMOS transistor 33 is in an off-state, the bit line BL remains at the initial level of the precharge state ($\frac{1}{2}$ Vcc is usually used).

When the signal $\phi 21$ rises, if the input signal DIN is at a LOW level, that is, the inverted signal DIN# is at a HIGH level, the voltage levels of the select signals S and S# become HIGH and LOW, respectively. Accordingly, the NMOS transistor 33 is turned on and the bit line BL is dropped to the GND level. On the other hand, because the NMOS transistor 34 is in an off-state, the bit line BL# keeps the initial level of the precharge state.

Needless to say, the above write operation is done for each of the examined memory cells 42 though the description was made in connection with a single examined memory cell 42.

In parallel with the above operation in connection with the examined memory cells 42, the following operation is carried out in connection with the reference memory cell 41.

The signal $\phi 12$ rises. In response to the rise of the signal $\phi 12$, the NMOS transistors 14 and 15 in the line data storage circuit 1 are turned on, so that the input data is written to the bit lines B and B#. It is to be noted that when the input signal DIN is at a HIGH level, the voltage levels of the bit lines B and B# become HIGH and LOW, respectively, and that when the input signal DIN is at a LOW level, the bit lines B and B# become LOW and HIGH, respectively. When a word line WL rises to a HIGH level, the sense amplifiers 51 and 52 in the sense amplifier array 5 are driven to amplify the pairs of the bit lines B and B#, and BL and BL# to a level enough to be written to the memory cells 41 and 42. Finally, the word line WL is dropped to finish the write operation to the memory cells 41 and 42. In the above manner, the same data is written to the memory cells 41 and 42 at the same time through the respective pairs of bit lines B and B#, and BL and BL#.

The following describes a read operation and an output evaluation operation.

When a read operation starts, a word line WL is raised as shown in FIG. 22, and the sense amplifiers 51 and 52 are driven, so that data in the memory cells 41 and 42 are read out to the respective pairs of bit lines B and B#, and BL and BL#. Then, the signal $\phi 12$ rises. In response to this signal $\phi 12$, the expected value signal E representing data written to the reference memory cell 41 is outputted to the bit line select circuit 2 in the form of an inverted signal E#. For starting a evaluation operation, the signal $\phi 31$ directed to the NMOS transistor 31 is dropped to a LOW level, the signal $\phi 32$ directed to the NMOS transistor 32 is raised to a HIGH level, and after that, the signal φ21 directed to the AND gates 21 and 22 of the bit line select circuit 2 are raised.

If the input data written to the reference memory cell 41 is a logical one ("1"), the expected value signal E becomes HIGH and therefore its inverted signal E# becomes LOW. At this time, the levels of the select signals S and S# become LOW and HIGH, respectively. Accordingly, the NMOS transistor 34 in the output evaluation circuit 3 is turned on, and thereby a signal at the level of the bit line BL# is inputted to the gate electrode of the NMOS transistor 35. If the read operation from the examined memory cell 42 is normally carried out, the bit line BL# must be at a LOW level. When the bit line BL# is at a LOW level, the gate electrode of the NMOS transistor 35 is provided with a signal of a LOW level, so that the NMOS transistor 35 keeps its off-state. In this case, a HIGH-level signal indicative of "coincidence" is outputted to the output line DOUT. On the other hand, if the read from the examined memory cell 42 results in error, the bit line BL# is at a HIGH level. In this case, the NMOS transistor 35 is turned on and a LOW-level signal representative of "non-coincidence" is outputted to the output line DOUT.

When data written to the reference memory cell 41 is a logical zero ("0"), the expected value signal E becomes LOW and therefore its inverted signal E# becomes HIGH. At this time, the voltage levels of the select signals S and S# become HIGH and LOW, respectively. Accordingly, the NMOS transistor 33 in the output evaluation circuit 3 is turned on, and thereby a signal of the level of the bit line BL is inputted to the gate electrode of the NMOS transistor 35. If the data reading from the examined memory cell 42 is normally executed, the bit line BL must be at a LOW level. When the bit line BL is at a LOW level, the gate electrode of the NMOS transistor 35 is provided with a signal of a LOW level, so that the NMOS transistor 35 keeps its off-state. As a result, a signal of a HIGH level indicative of "coincidence" is outputted to the output line DOUT. On the other hand, if the data read from the examined memory cell 42 fails, the bit line BL is at a HIGH level. In this case, the NMOS transistor 35 is turned on and a LOW-level signal representative of "non-coincidence" is outputted to the output line DOUT.

As described above, whether the data written to the memory cells 41 and 42 at the same time is a logical zero or one, the DRAM outputs a HIGH-level signal indicative of "coincidence" to the output line DOUT when the data is normally read from the memory cell 42, and outputs a LOW-level signal indicative of "non-coincidence" when the data is erroneously read out from the memory cell 42.

The above read and evaluation operation is executed simultaneously for all the examined memory cells 42 storing data equivalent to a line data, independently of each other. Therefore, the operating test of the device can be performed at a high speed.

Figure 23:
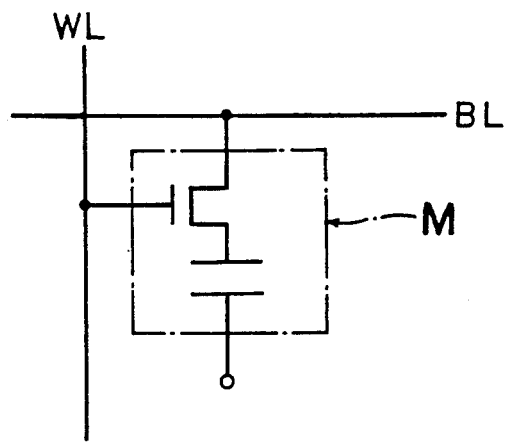
FIGS. 23 to 25 are diagrams each showing a state in which a memory cell is connected with a bit line or bit lines.
Figure 24:
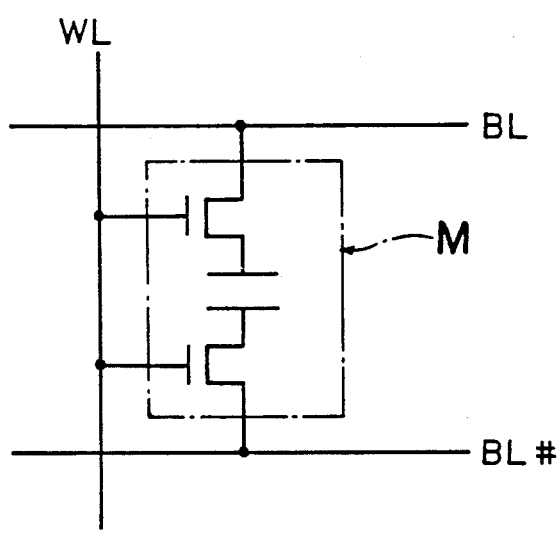
Figure 25:
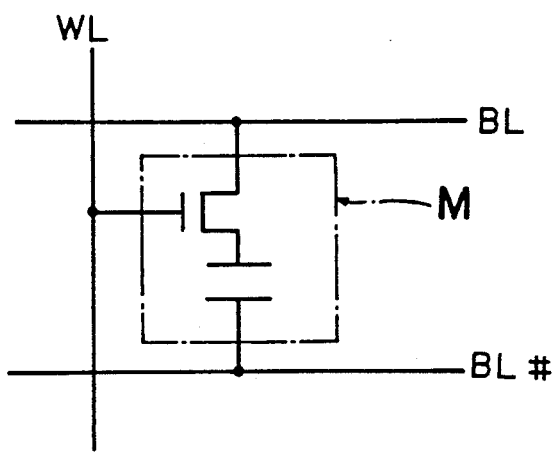

In the present embodiment, the reference memory cell 41 is connected with only one B or B# of the complementary bit lines B and B# and the memory cell 42 with only one BL or BL# of the complementary bit lines BL and BL#. This case corresponds to a case shown in FIG. 23, wherein a memory cell M is constituted from a MOS transistor and a capacitor which are connected in series and a cell plate voltage is applied to a terminal of the capacitor. The present invention, however, is not limited to this case, and can be applied to a case wherein a memory cell is connected to both of the complementary bit lines BL and BL# (U.S. Pat. No. 4,792,922), as shown in FIGS. 24 and 25.

Second Embodiment

Figure 3:
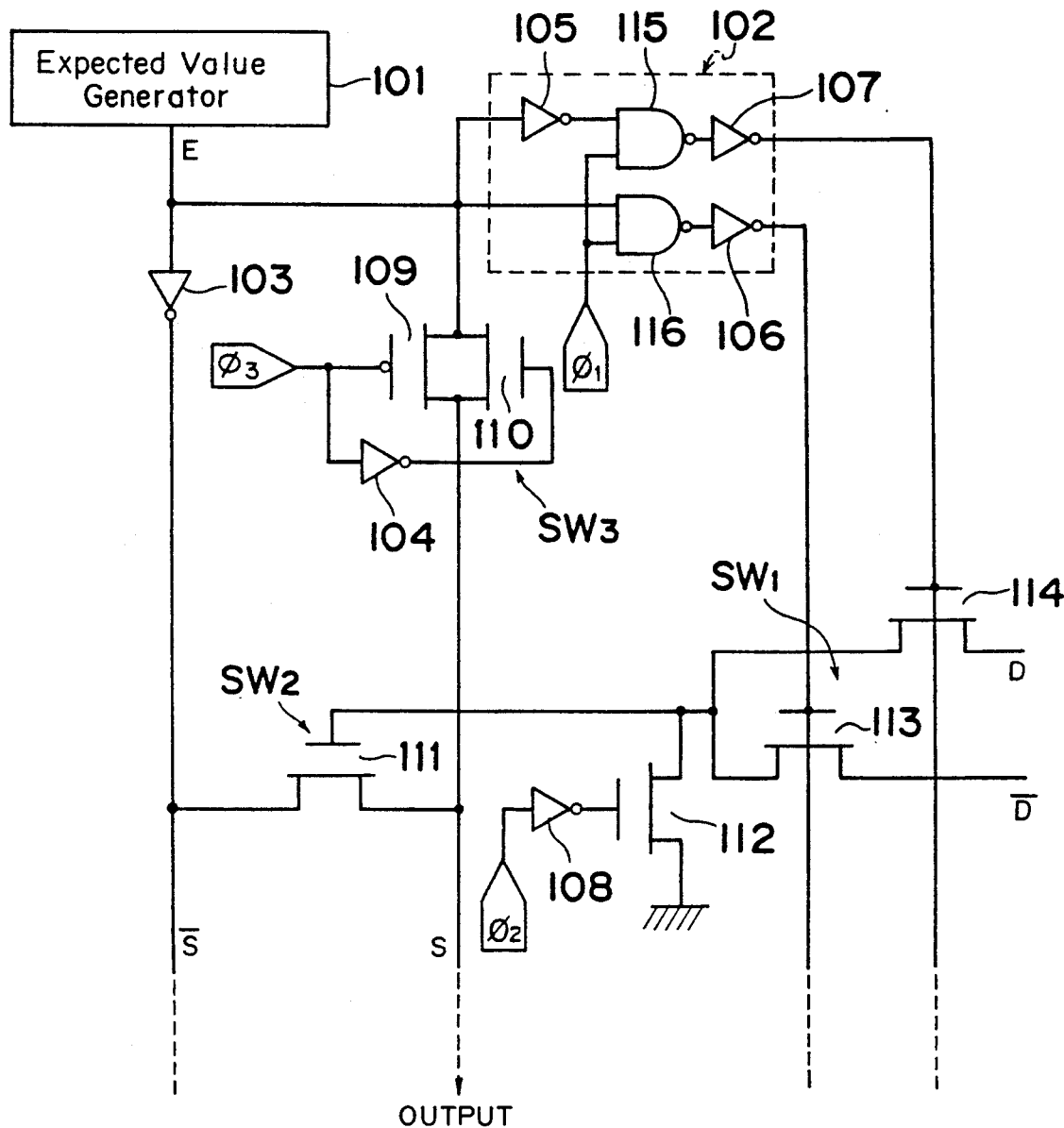
FIG. 3 is a circuit diagram of the test circuit of FIG. 2.
Figure 4:
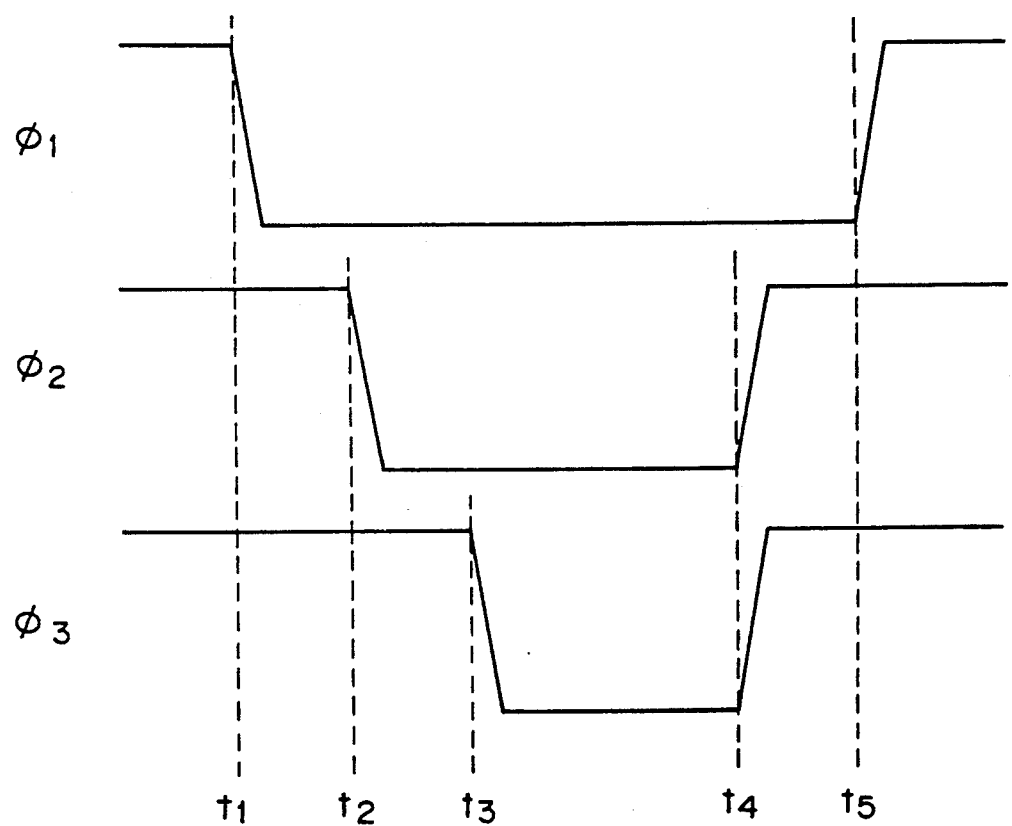
FIG. 4 is a timing chart of control signals to operate the test circuit.

FIG. 3 is a circuit diagram of a test circuit for a semiconductor memory device according to a second embodiment of the present invention, and FIG. 4 shows input waveforms of the control signals φ1, φ2, and φ3 inputted to the test circuit of FIG. 3.

In FIG. 3, a reference number 101 indicates an expected value generator equivalent to the line data storage circuit 1 shown in FIG. 1, a reference number 102 indicates a data signal select circuit equivalent to the bit line select circuit 2 shown in FIG. 1. Reference numbers 103-108 designate inverters, a reference numbers 109 is a PMOS transistor, reference numbers 110-114 designate NMOS transistors, and reference numbers 115 and 116 designate NAND gates. The transistors 112-114 constitute a first switch SW1, and the transistor 111 constitutes a second switch SW2. These first and second switches SW1, SW2 constitute an output evaluation circuit. In addition, transistors 109 and 110 constitute a switch SW3 for permitting an expected value E to be temporarily held in an output signal line S.

This test circuit confirms whether the expected value E outputted from the expected value generator 101 is the same level as a data line D in the following manner.

It is to be noted that the expected value E may be one of two values, Vcc or the GND. In addition, data of mutually reverse phase are always inputted to data lines D and $\overline{D}$. One of these data is obtained by inputting the signal outputted from one bit terminal into an inverter (not shown in the figure), and the other data is obtained directly from the bit terminal.

First, the level of the signal φ1 is dropped at the time t1 as shown in FIG. 4, and the NMOS transistors 113, 114 are set off through the data signal select circuit 102. Next, the level of the signal φ2 is lowered at the time t2, transistor 112 is set on through the inverter 108, and a node connected to the NMOS transistor 111 is discharged. The NMOS transistor 111 thus becomes off. The level of the signal φ3 is then lowered at the time t3, the PMOS transistor 109 and NMOS transistor 110 are made on, and the expected value is applied to the output signal line S.

To compare the level of the expected value and the level of the data line D, the signals φ2 and φ3 are raised at the time t4 to turn off the transistors 109, 110, and 112. Next, the level of φ1 is raised at the time t5 to bring the data line select circuit 102 into an enabled state wherein the data line select circuit is ready to operate in response to the expected value.

When the expected value is Vcc, the transistor 113 is made on through the data line select circuit 102, and the output of the data line $\overline{D}$ is inputted to a gate electrode of the n-transistor 111. If at this time the levels of the expected value and of the data line D are coincident, the level of the data channel $\overline{D}$ will be the GND. The n-transistor 111 will thus remain off, and the expected value will be outputted directly to the output signal line S. Conversely, if the levels of the expected value and of the data channel D are non-coincident, the data line $\overline{D}$ is Vcc. The n-transistor 111 is therefore on, and the output signal line S is rewritten to the level of the fail signal line $\overline{S}$. As a result, data which is reverse phase to the expected value is outputted to the output signal line S.

However, when the expected value is at the level of the ground (GND), the transistor 114 is turned on in response to the signal via the data line select circuit 102, and the level of the data line D is outputted to the gate electrode of the n-transistor 111. If it is assumed that the expected value and the output of the data line D are coincident, the output of the data line D is at the level of the GND. Thus, the n-transistor 111 remains off and the expected value is outputted directly to the output signal line S. Conversely, if the level of the expected value and the level of the data channel D are non-coincident, the data line D is at the level of Vcc. The n-transistor 111 therefore becomes on, the output signal line S is rewritten to the level of the fail signal line $\overline{S}$, and as a result data which is reverse phase to the expected value is outputted to the output signal line S.

As described hereinabove, if the expected value and the output of the data line are coincident, the transistor 111 is off and the expected value is outputted to the output signal line S. Furthermore, if the expected value and the output of the data channel are non-coincident, the the transistor 111 is on, and as a result the level of the fail signal line $\overline{S}$, i.e., data of a phase reverse to that of the expected value, is outputted to the output signal line S.

This circuit can also be designed so that a plurality of pairs of data lines may use the data select signal from the data lie select circuit 102, the output signal line S and the fail signal line $\overline{S}$ in common. If this circuit is used, for example, in a semiconductor memory device such as DRAMs, SRAMs, ROMs, or others, the device test time can be reduced because the data outputted to the multiple data lines D, $\overline{D}$ can be evaluated at one time. It is also possible to detect an error even if the data outputted from all bits are in error. In addition, testing can be completed without using an exclusive OR or other complicated circuit construction.

Figure 5:
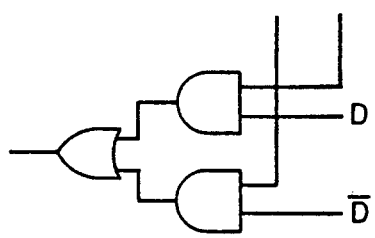
FIG. 5 is a modification of a first switch in the test circuit.

It is to be noted that a PMOS device or a CMOS device can be substituted for the NMOS transistors 111-114, and the first switch SW1 can be replaced with a logical circuit as shown, for example, in FIG. 5.

Third Embodiment

Figure 6:
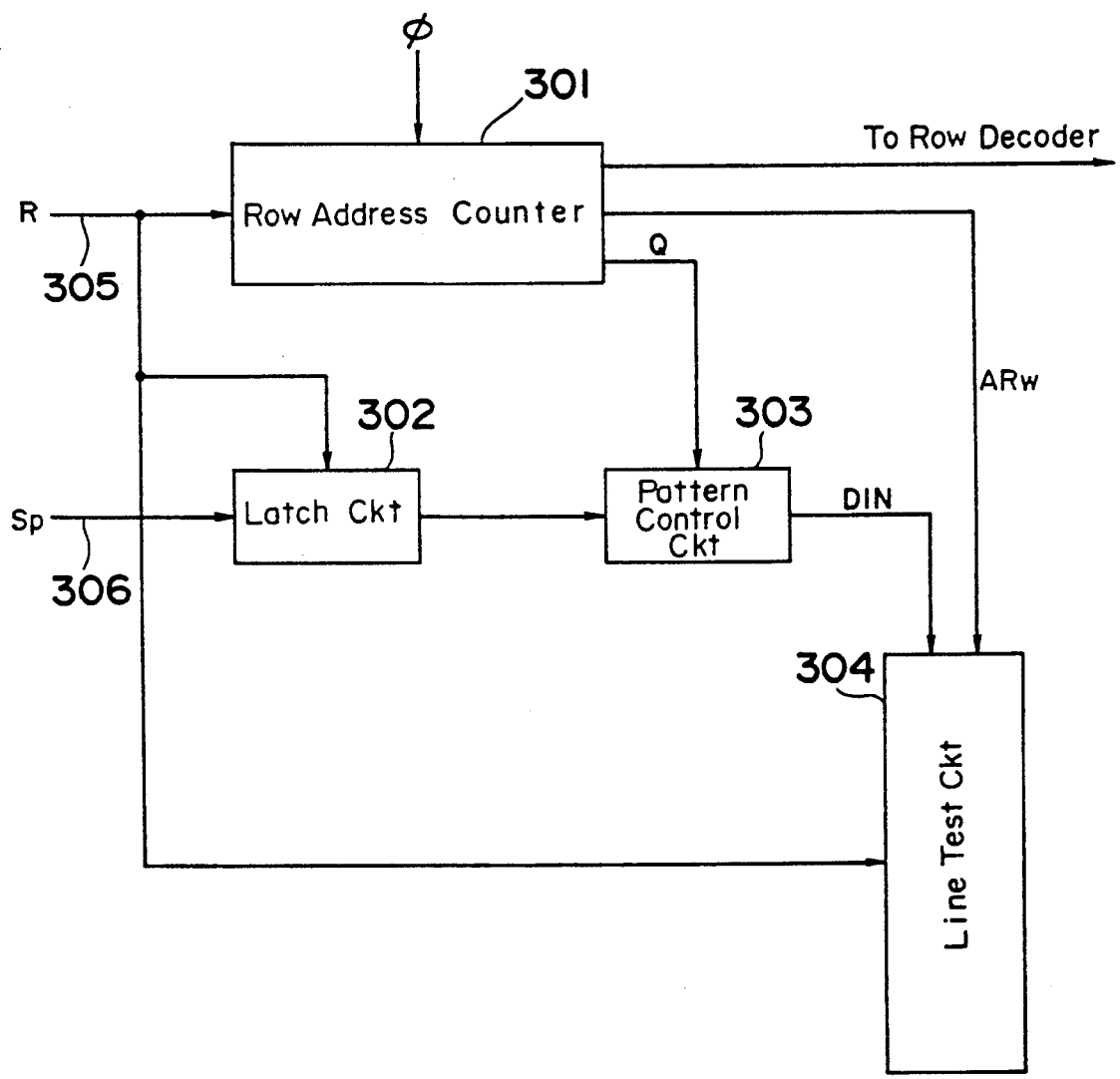
FIG. 6 is a block diagram of an essential part of a semiconductor memory device according to a third embodiment of the present invention.

FIG. 6 is a block diagram showing essential components of a semiconductor memory device according to a third embodiment of the present invention. In FIG. 6, a reference number 301 indicates a row address counter, a reference number 302 indicates a latch circuit, a reference number 303 indicates a pattern control circuit, and a reference number 304 indicates a line test circuit. These circuits operate as described hereinbelow.

Specifically, when a line test mode is set, a line test signal R is inputted via a line test signal line 305. At this time, a count input signal $\phi$ inputted from an external source or a count input signal inputted from an internal source in the form of pulse is received by the row address counter 301, which counts the row address to automatically change the row address, and outputs the counted row address to a row decoder (not shown). At the same time that the line test signal R is inputted, the latch circuit 302 latches test pattern data signals Sp inputted from an input terminal 306 which can select the test pattern. One of the pattern data signals latched by the latch circuit 302 is selected by the pattern control circuit 303 in response to the address data outputted from the row address counter 301, and the obtained pattern data signal Sp is inputted to the line test circuit 304.

Figure 11:
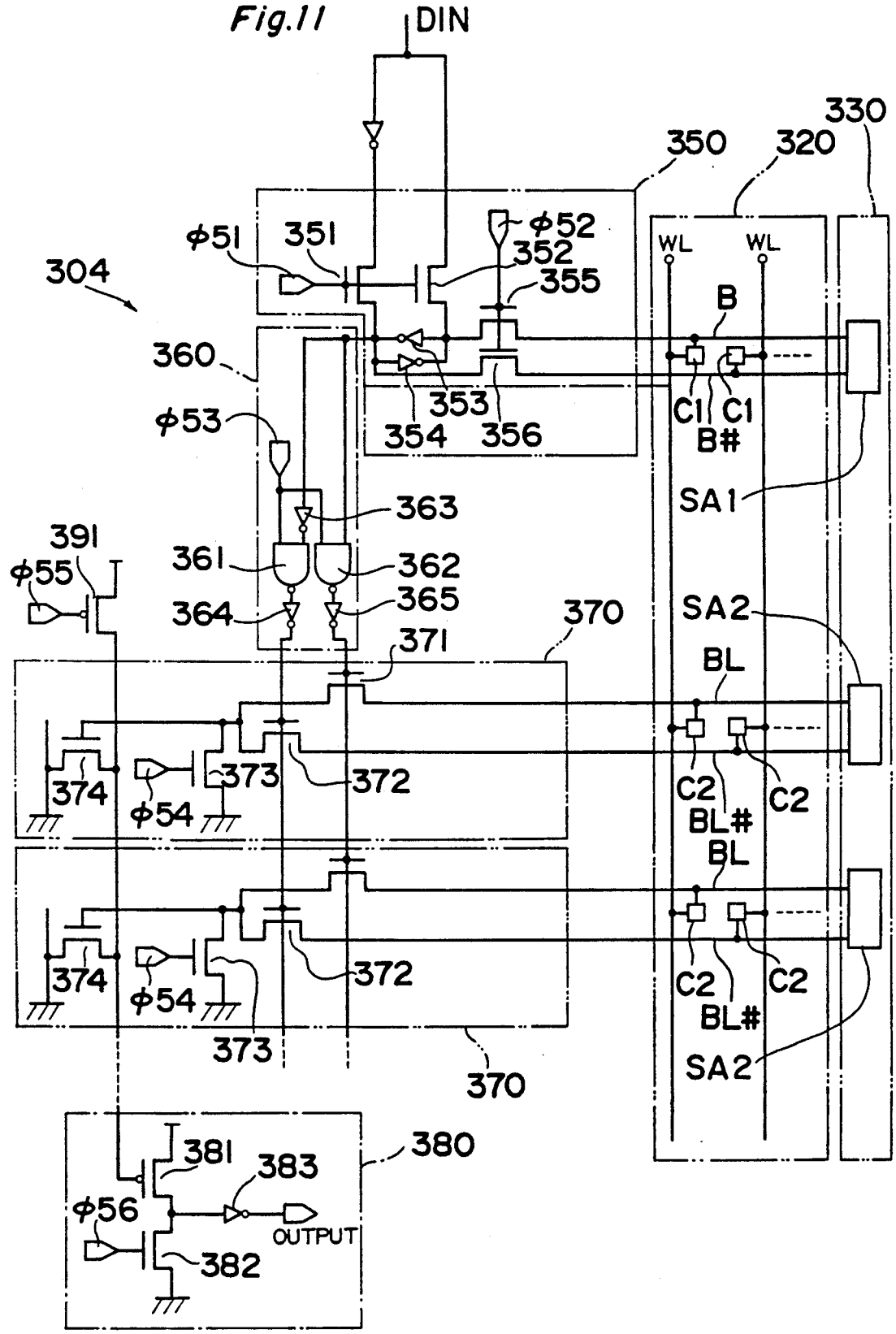
FIG. 11 is a circuit diagram of a line test circuit used in the semiconductor memory device of the third embodiment.

In the line test circuit 304, as shown in FIG. 11, the input data is written through each bit line B, B#; BL, BL# to memory cells C1, C2 connected to a word line WL selected by the row decoder (not shown). When the row address counter 301 counts up to the N (N=maximum address plus one), a read test signal ARw outputted from the row address counter 301 is received by the line test circuit 304, thus setting a read mode, and the data written to each bit line is thus read. If all data read from each bit line is correct, a pass signal is outputted, but if there is an error in even one data, a fail signal is outputted.

Figure 7:
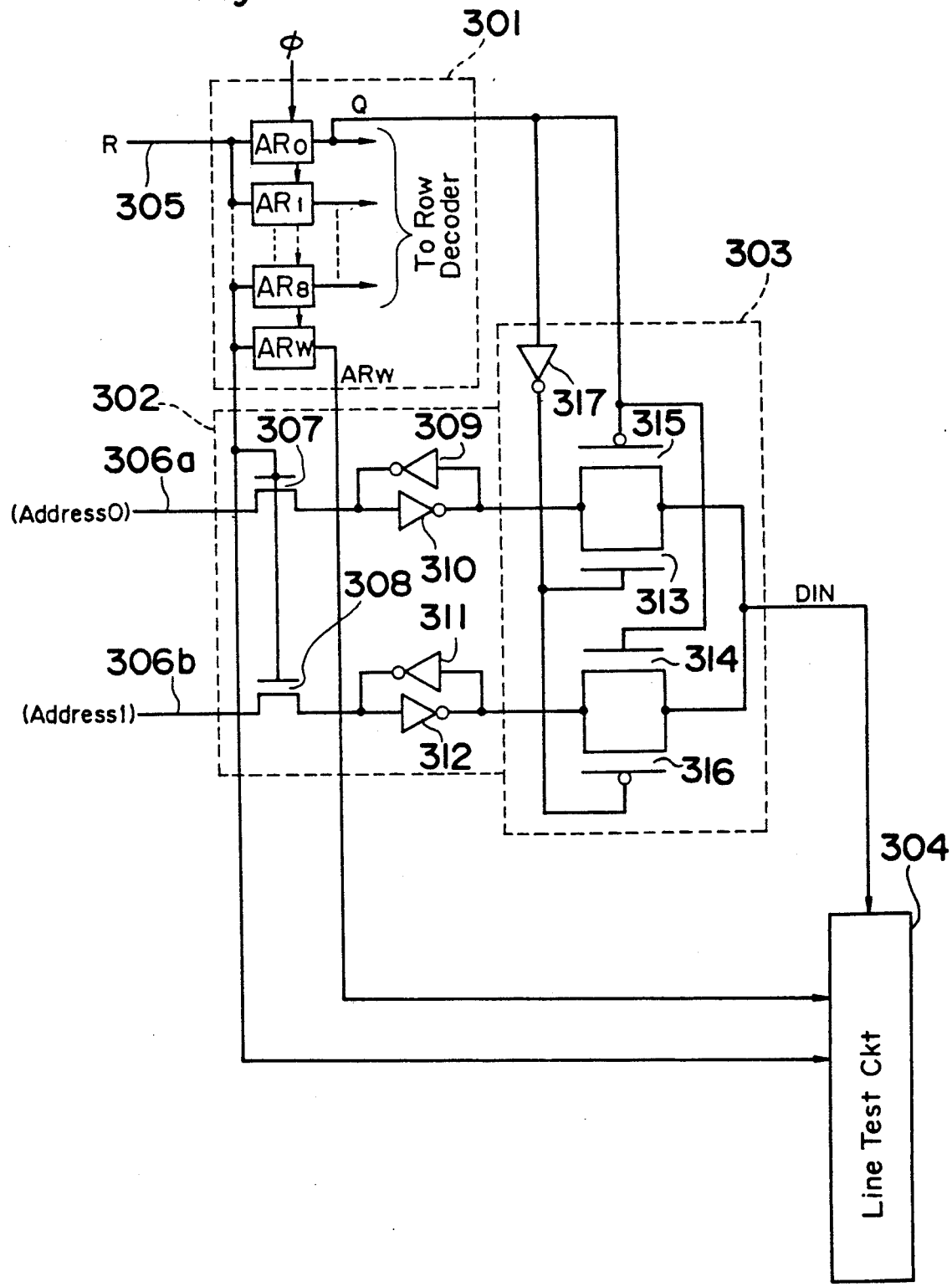
FIG. 7 is a circuit diagram of the essential part of the semiconductor memory device of FIG. 6.

FIG. 7 shows specific circuits for each block shown in the block diagram in FIG. 6.

In FIG. 7, the row address counter 301 has circuits from AR0, corresponding to address $A_0$, to AR8, corresponding to address $A_8$, and a circuit ARw, corresponding to the row address (max +1). The row address counter 301 is reset in response to the line test signal R, and then counts the row address in response to the count input signal $\phi$.

The latch circuit 302 has NMOS transistors 307, 308, which are turned on in response to the line test signal R and are connected respectively to input terminals 306a, 306b used for inputting the test pattern data signals Sp. The latch circuit 302 also has two parallel-connected but oppositely-oriented inverters 311, 312 which latch data inputted from the input terminal 306a, and two parallel-connected but oppositely-oriented inverters 309, 310 which latch data inputted from the input terminal 306b.

The pattern control circuit 303 has NMOS transistors 313 and 314, PMOS transistors 315 and 316, and an inverter 317. In response to output signal from the circuit AR0 corresponding to address 0, the pattern control circuit 303 outputs either data latched by the inverters 309, 310 or data latched by the inverters 311, 312. Specifically, when output from the circuit AR0 is 0, the transistors 313, 315 are turned on, and the data latched by the inverters 309, 310 is output to the line test circuit 304. On the other hand, when output from the circuit AR0 is 1, the transistors 314, 316 are turned on, and the data latched by the inverters 311, 312 is outputted to the line test circuit 304.

The line test circuit 304 is constructed as shown in FIG. 11.

In FIG. 11, a reference number 320 indicates a memory cell array having a plurality of memory cells C1, C2, and a reference number 330 indicates a sense amplifier array including a plurality of sense amplifiers SA1, SA2. The memory cells C1, C2 in each row are connected to word lines WL and are selected simultaneously by the respective word lines WL. FIG. 11 does not show all of the memory cells, word lines, sense amplifiers, etc for the sake of simplicity. A reference number 350 indicates a line data storage circuit, a reference number 360 indicates a bit line select circuit, a reference number 370 indicates an evaluation circuit, and a reference number 380 indicates an output circuit.

The line data storage circuit 350 has NMOS transistors 351 and 352 which are simultaneously controlled by a signal $\phi 51$, a latch circuit constructed from inverters 353, 354 for latching data inputted via the transistors 351 and 352, and NMOS transistors 355, 356 which are controlled simultaneously by a signal $\phi 52$. The inverters 353 and 354 of the latch circuit are parallel to each other but oppositely oriented. The line data storage circuit 350 writes through test bit lines B, B# data latched by the latch circuit to a memory cell C1 connected to the bit line B or B# by controlling the transistors 355, 356, and reads the written data.

The bit line select circuit 360 has NAND circuits 361 and 362, which receive a signal $\phi 53$, and inverters 363, 364 and 365.

When the signal $\phi 53$ is at a LOW level, outputs from both inverters 364 and 365 are also LOW. When the signal $\phi 53$ becomes HIGH, the outputs of inverters 364 and 365 become LOW and HIGH, respectively, if the data from the line data storage circuit 350 is HIGH. But if the input data from the line data storage circuit 350 is LOW when the signal $\phi 53$ is HIGH, the outputs of inverters 364, 365 become HIGH and LOW, respectively.

The evaluation circuit 370 is provided for each pair of bit lines BL, BL#. Each evaluation circuit 370 has NMOS transistors 371, 372 controlled by an output signal from the bit line select circuit 360, an NMOS transistor 373 controlled by a signal $\phi 54$, and an NMOS transistor 374 controlled by a signal outputted through the bit lines BL, BL#. Power is supplied to the NMOS transistor 374 via a PMOS transistor 391 controlled by a signal $\phi 55$.

The output circuit 380 has a PMOS transistor 381 controlled by a signal outputted from the evaluation circuits 370, an NMOS transistor 382, and a inverter 383. The NMOS transistor 382 is switched on or off by a signal $\phi 56$ to initialize the output level.

The write operation and the read and evaluation operation of the line test circuit 304 constructed as above are described hereinbelow.

In the write operation, the signal $\phi 51$ is set HIGH to turn on the NMOS transistor 351, 352, and data DIN is inputted. The input data DIN is inputted straight to the NMOS transistor 352, but is inverted before inputted to the NMOS transistor 351. The input data is latched by the inverters 353 and 354. Next, when the signal $\phi 52$ is set HIGH and the NMOS transistors 355, 356 become continuous or turned on, the input data DIN is written to the bit lines B, B#. The signal $\phi 53$ is set HIGH parallel to this operation. In response to the signal $\phi 53$ of a HIGH level, the outputs of the inverters 364 and 365 become HIGH and LOW, respectively, when the input data is HIGH (i.e., when the input data to the bit line select circuit 360 is LOW). Therefore, NMOS transistor 372 is turned on, and the bit line BL# is dropped to a GND level. However, when the input data DIN to the line data storage circuit 350 is LOW, the NMOS transistor 371 conversely becomes continuous, and the bit line BL is dropped to the GND level. Finally, when the level of a selected word line WL is raised, data is written to the memory cells C1, C2, C2, ... connected to the word line through bit line pairs B, B# and BL, BL#.

When the written data is read, the level of the word line is first raised. Thus, the data written to the above memory cells C1, C2, C2, ... are read respectively through the bit line pairs B, B#; BL, BL#; ... Next, when the level of the signal $\phi 52$ is raised, the data read through the bit line B is inverted by the inverter 353 and inputted to the bit line select circuit 360.

In the evaluation operation, signal $\phi 53$ is set HIGH after setting signal $\phi 54$ LOW and signal $\phi 55$ HIGH. If at this time the input data is a logical 1, the data read through the bit line B is HIGH. Thus, LOW level data is inputted to the bit line select circuit 360, and the output of the inverter 364 becomes HIGH, so that the NMOS transistor 372 is turned on and that the level of the bit line BL# is inputted to the gate electrode of the NMOS transistor 374.

If the read operation through the bit lines BL, BL# was executed normally, the bit line BL# should be a LOW level as described above. Therefore, the NMOS transistor 374 remains non-continuous, and the PMOS transistor 381 of the output circuit 380 also remains non-continuous. Therefore, a HIGH level indicating coincidence is outputted from the inverter 383. However, if there was an error in the read operation through the bit lines BL, BL#, the bit line BL# should be HIGH. Therefore, both the NMOS transistor 374 and the PMOS transistor 381 of the output circuit 380 will be continuous, and a LOW level indicating non-coincidence is outputted from the inverter 383.

The same principle applies when the input data is a logical 0. If reading is normal, a HIGH level is outputted, and if there is a reading error, a LOW level is outputted.

Figure 8:
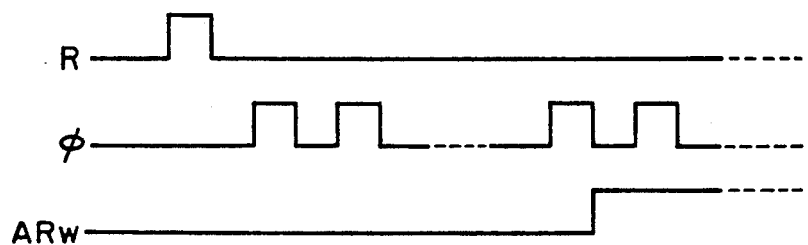
FIG. 8 is a timing chart showing timing of a line test according to the third embodiment.
Figure 9:
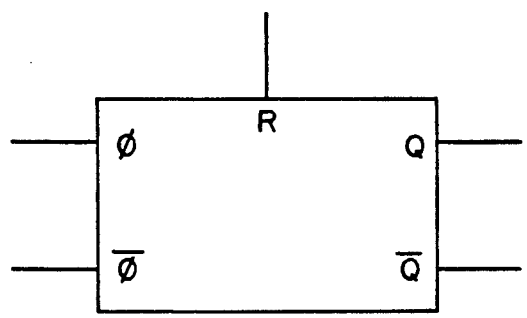
FIG. 9 is a circuit diagram of part of a row address counter in the third embodiment, showing a circuit for a single row address.
Figure 10:
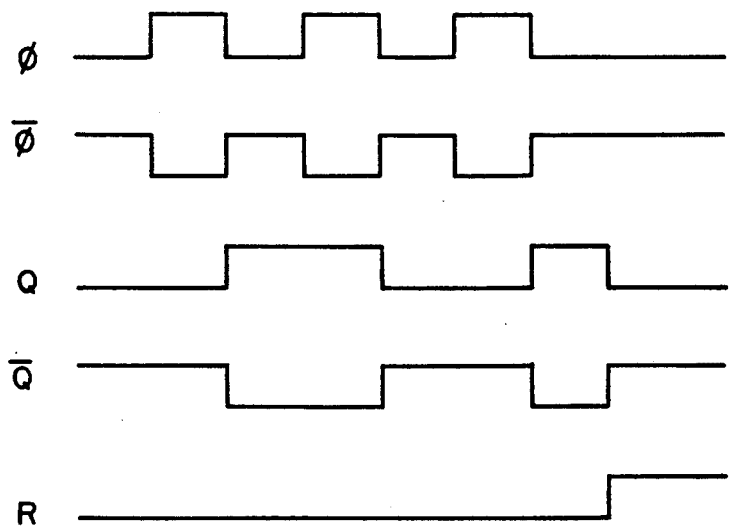
FIG. 10 is timing chart for signals to control the circuit of FIG. 9.

FIG. 8 is a diagram showing the timing of the line test. FIG. 9 is an outline of the flip-flop circuit for one address in the row address counter 301, and FIG. 10 shows an example of operation waveforms of the circuit of FIG. 9.

The operation of the circuits shown in FIGS. 6 and 7 is described hereinbelow.

First, a line test pulse R is inputted to the row address counter 301 through the line test signal line 305, and the row address counter 301 is reset. At the same time, the NMOS transistors 307, 308 of the latch circuit 302 are set ON, so that the data at the input terminals of addresses 0 and 1 from test pattern signal lines 306a, 306b are latched by the latch circuit of the inverters 309, 310 and inverters 311, 312, respectively. If the data at the addresses 0 and 1 are both 0, a 00 pattern test can be executed, and if both data are 1, a 11 pattern test can be executed. The 00 pattern writes data of a logical 0 to the memory cells C1, C2, ... of any word line WL. The 11 pattern writes data of a logical one to the memory cells of any word line WL. Furthermore, if the address 0 and address 1 data are 0 and 1, respectively, a 01 pattern test can be executed, and if 1 and 0, respectively, a 10 pattern test can be executed. In the 01 pattern test, data having a logical 0 is written to the memory cells connected to odd word lines while data having a logical 1 is written to the memory cells connected to even word lines. On the other hand, in the 10 pattern test, data having a logical 1 is written to the memory cells connected to the odd word lines while data having a logical 0 is written to the memory cells connected to the even word lines.

The data from address 0 to address 8 are outputted from the row address counter 301 to the row decoder (not shown), and the row decoder selects a word line based on this data. The pattern control circuit 303 then receives the output from the circuit AR0, and outputs the data latched by the latch circuit 302 to the line test circuit 304 as input data DIN.

The line test circuit 304 executes an input data writing if the output from the ARw counter circuit in the row address counter 301 is 0, and executes a reading and evaluation operation of the written data if the output from the ARw counter circuit is 1.

Thus, a word line to be tested can be automatically selected because the row address is automatically changed by the row address counter 301. Furthermore, it is not necessary to provide an input data DIN from an external source to the line test circuit 304 each time a line test for each word line is executed because the input data DIN to the line test circuit 304 is selected from the line pattern data latched by the latch circuit 302 in response to the address data outputted by the row address counter 301. Therefore, the line test can be executed simply, and line test time can be reduced.

Fourth Embodiment

Figure 12:
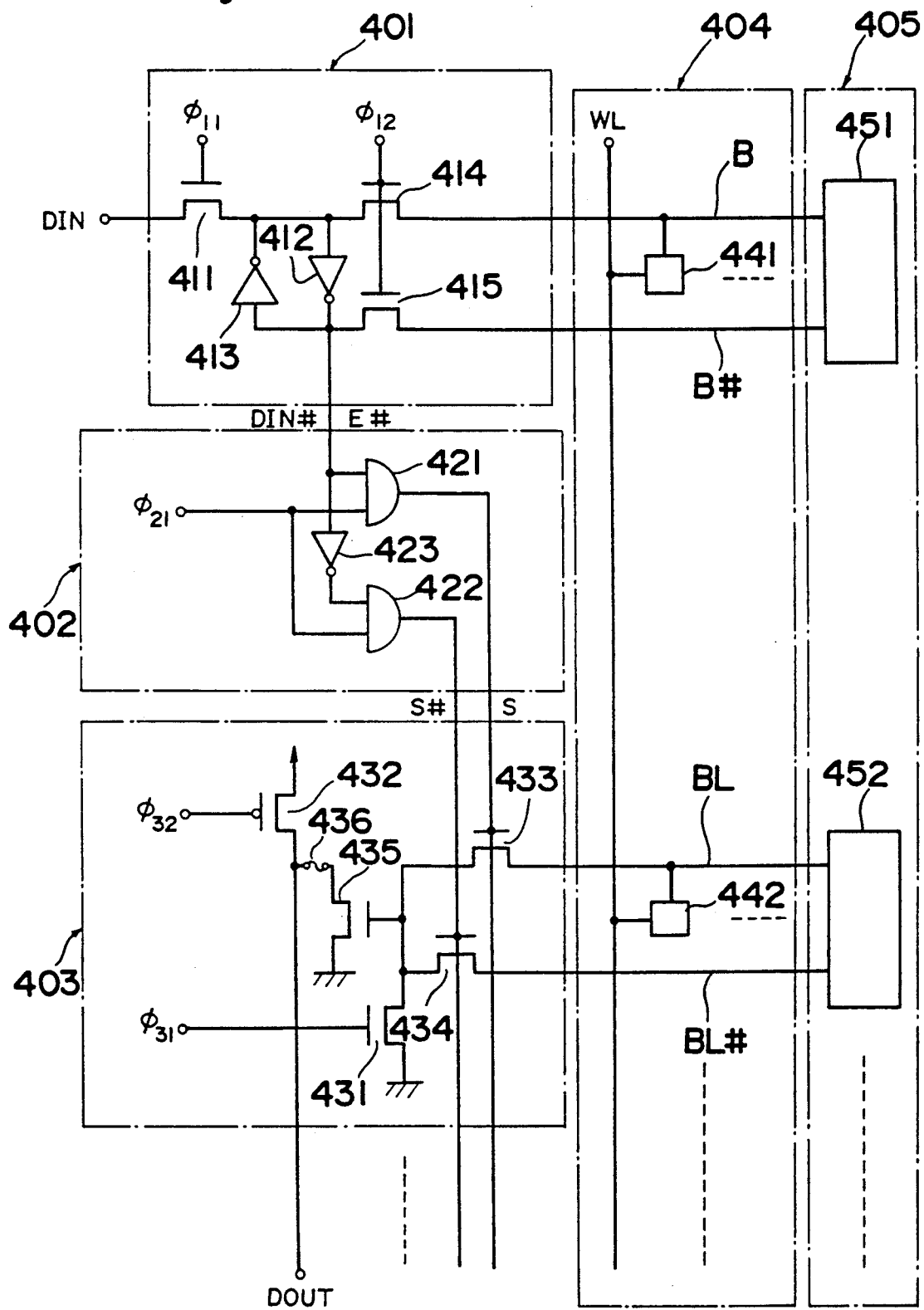
FIG. 12 is a circuit diagram of a semiconductor memory device according to a fourth embodiment of the present invention.

FIG. 12 shows a DRAM according to a fourth embodiment of the present invention. The DRAM has a line data storage circuit 401, a bit line select circuit 402 and a plurality of output evaluation circuits 403 (only one is shown in the figure). A reference numeral 404 indicates a memory cell array including a plurality of memory cells 441, 441, . . . ; 442, . . . though only two of the memory cells 441, 442 are shown in the figure. A reference numeral 405 indicates a sense amplifier array including a plurality of sense amplifiers 451, 452, 452, . . . though only two of the sense amplifiers 451, 452 are shown in the figure. The memory cells 441, 442, 442, . . . in each row are connected to respective word lines WL and are selected simultaneously by the respective word lines WL (only one of the word lines WL is shown in FIG. 12 for the sake of simplicity). The memory cell 441 on each word line is a reference memory cell directed to a line test, namely, data in the memory cell 41 is used as reference data for comparison with data read from examined memory cells 442.

Data writing to and data reading from the reference memory cell 441 are carried out through a pair of complementary bit lines B and B# while data writing to and reading from the examined memory cells 442 are carried out by the other pairs of complementary bit lines BL and BL# (only one pair BL and BL# is shown in the figure). The sense amplifiers 451 and 452 amplify the potential difference between the bit lines B and B# and that of the bit lines BL and BL#.

The line data storage circuit 401 has an NMOS transistor 411 controlled by a signal $\phi 11$, inverters 412 and 413 connected in parallel but in opposite directions, NMOS transistors 414 and 415 which are simultaneously controlled by a signal $\phi 12$. The line data storage circuit 401 writes data, which is an input signal DIN, to the reference memory cell 441 through the bit lines B and B#. On the other hand, data DIN#, which is obtained by inverting the input signal DIN, is outputted from the line data storage circuit 401 to the bit line select circuit 402. Data written to the memory cell 441 is read out as an expected value signal E. After inverted, the signal E is outputted to the bit line select circuit 402 as signal E#.

The bit line select circuit 402 has AND gates 421 and 422 to receive a signal $\phi 21$, and an inverter 423 connected between respective input terminals of the AND gates 421 and 422. In response to the inverted signal DIN# or the inverted expected value signal E# from the line data storage circuit 401, the bit line select circuit 402 outputs a pair of select signals S and S# for selecting the bit line BL or BL# of the examined memory cell 442 in accordance with the level of the signal DIN# or E#.

Each output evaluation circuit 403 has an NMOS transistor 435 connected between an output line DOUT and the ground, and NMOS transistors 433 and 434 respectively connected to the bit lines BL and BL#. A gate electrode of the NMOS transistor 435 is connected with the complementary bit lines BL and BL# through the NMOS transistors 433, 434, respectively.

The NMOS transistors 433 and 434 are respectively controlled by the select signals S and S# outputted from the bit line select circuit 402. Each output evaluation circuit 403 also has an NMOS transistor 431 which is connected between the gate electrode of the NMOS transistor 435 and the ground and which is controlled by a signal $\phi 31$. A fuse 436 is connected between the NMOS transistor 435 and the output line DOUT. Accordingly, the fuse 436 can separate the output line DOUT from the NMOS transistor 435, and therefore from the bit lines BL and BL#. One of the output evaluation circuits 403 have a common p-channel metal oxide semiconductor (PMOS) transistor 432 which is connected between a power source and the output line DOUT and which is controlled to be turned on or off by a signal $\phi 32$.

The DRAM with the above structure acts as described below, based on the timing as shown in FIG. 22. In FIG. 22, a dotted line indicates timing for a write operation and a solid line indicates timing for a readout operation.

The following describes a write operation.

In a precharge state (a leftmost part of the timing chart in FIG. 22), the signal $\phi 21$ is at a LOW level, outputs from AND gates 421 and 422 in the bit line select circuit 402 are both at a LOW level, and accordingly, no continuity exists in the NMOS transistors 433 and 434, that is, the NMOS transistors 433 and 434 are in an off-state. At this time, the signal $\phi 31$ is at a HIGH level and the signal $\phi 32$ is at a LOW level.

When the write operation starts, the level of the input signal DIN becomes HIGH or LOW in accordance with an input data. Then, the signal $\phi 11$ rises, so that the NMOS transistor 411 in the line data storage circuit 401 is turned on. As a result, the input signal DIN is latched by the inverters 412 and 413. After that, the signal $\phi 21$ rises. At this time, if the input signal DIN is at a HIGH level, that is, the inverted signal DIN# is at a LOW level, the voltage level of the select signal S becomes LOW and that of the other select signal S# becomes HIGH. As a result, the NMOS transistor 434 is turned on, so that the bit line BL# drops to a ground (GND) level. On the other hand, because the NMOS transistor 433 is in an off-state, the bit line BL remains at the initial level of the precharge state ($\frac{1}{2}$ Vcc is usually used).

When the signal $\phi 21$ rises, if the input signal DIN is at a LOW level, that is, the inverted signal DIN# is at a HIGH level, the voltage levels of the select signals S and S# become HIGH and LOW, respectively. Accordingly, the NMOS transistor 433 is turned on and the bit line BL drops to the GND level. On the other hand, because the NMOS transistor 434 is in an off-state, the bit line BL# keeps the initial level of the precharge state.

In parallel with the above operation in connection with the examined memory cell 442, the following operation is carried out in connection with the reference memory cell 441.

The signal $\phi 12$ rises. In response to the rise of the signal $\phi 12$, the NMOS transistors 414 and 415 in the line data storage circuit 401 are turned on, so that the input data is written to the bit lines B and B#. It is to be noted that when the input signal DIN is at a HIGH level, the bit lines B and B# become HIGH and LOW, respectively, and that when the input signal DIN is at a LOW level, the bit lines B and B# become LOW and HIGH, respectively. After a word line WL is raised, the sense amplifiers 451 and 452 in the sense amplifier array 405 are driven to amplify the pairs of the bit lines B and B#, and BL and BL# to a level enough to be written to the memory cells 441 and 442. Finally, the word line WL is dropped to finish the write operation to the memory cells 441 and 442. In the above manner, the same data is written to the memory cells 441 and 442 at the same time through the respective pairs of bit lines B and B#, and BL and BL#.

The following describes a readout operation and an output evaluation operation.

When a read operation starts, a word line WL rises as shown in FIG. 22, and the sense amplifiers 451 and 452 are driven, so that data in the memory cells 441 and 442 are read out to the respective pairs of bit lines B and B#, and BL and BL#. Then, the signal $\phi 12$ rises. In response to this signal $\phi 12$, the expected value signal E representing data written to the memory cell 441 is outputted to the bit line select circuit 402 in the form of an inverted signal E#. For starting a evaluation operation, the signal $\phi 31$ falls to a LOW level, the signal $\phi 32$ rises to a HIGH level, and after that, the signal $\phi 21$ rises.

If the input data written to the reference memory cell 441 is a logical one ("1"), the expected value signal E becomes HIGH and therefore its inverted signal E# becomes LOW. At this time, the selected signals S and S# become LOW and HIGH, respectively. Accordingly, the NMOS transistor 434 in the output evaluation circuit 403 is turned on, and thereby a signal at the level of the bit line BL# is inputted to the gate electrode of the NMOS transistor 435. If the read operation from the examined memory cell 442 is normally carried out, the bit line BL# must be at a LOW level. When the bit line BL# is at a LOW level, the gate electrode of the NMOS transistor 435 is provided with a LOW-level signal, so that the NMOS transistor 435 keeps its off-state. As a result, a HIGH-level signal indicative of "coincidence" is outputted to the output line DOUT. On the other hand, if the data read from the examined memory cell 442 results in error, the bit line BL# is at a HIGH level. In this case, the NMOS transistor 435 is turned on and a LOW-level signal representative of "non-coincidence" is outputted to the output line DOUT.

When data written to the reference memory cell 41 is a logical zero ("0"), the expected value signal E becomes LOW and therefore its inverted signal E# becomes HIGH. At this time, the select signals S and S# become HIGH and LOW, respectively. Accordingly, the NMOS transistor 433 in the output evaluation circuit 403 is turned on, and thereby a signal at the level of the bit line BL is inputted to the gate electrode of the NMOS transistor 435. If the data reading from the examined memory cell 442 is normally executed, the bit line BL must be at a LOW level. When the bit line BL is at a LOW level, the gate electrode of the NMOS transistor 435 is provided with a signal of a LOW level, so that the NMOS transistor 435 keeps its off-state. As a result, a signal of a HIGH level indicative of "coincidence" is outputted to the output line DOUT. On the other hand, if the data reading from the examined memory cell 442 results in error, the bit line BL is at a HIGH level. In this case, the NMOS transistor 435 is turned on and a LOW-level signal representative of "non-coincidence" is outputted to the output line DOUT.

As described above, whether the data written to the memory cells 441 and 442 at the same time are a logical zero or one, the DRAM outputs a signal indicative of "coincidence" when the data is normally read out from the examined memory cell 442, and outputs a signal indicative of "non-coincidence" when the data is erroneously read out from the memory cell 442.

The above read and evaluation operation is executed simultaneously for all the memory cells 442 storing data equivalent to a line data, independently of each other. Therefore, the operating test of the device can be performed at a high speed. In addition, bit lines connected to a memory cell 442 whose data has been erroneously read can be separated from the output line DOUT by cutting a corresponding fuse 436. Therefore, even though there is a defect in any of memory cells selected by a word line, after the bit lines connected to the defective memory cell have been separated from the output line DOUT by cutting the fuse, the operation test for memory cells on the remaining bit lines can be continued without any trouble and in the same manner as executed before. This makes the line test much simpler and faster.

In the present embodiment, the reference memory cell 441 is connected with only one B of the bit lines B and B# and the examined memory cell 442 with only one BL of the bit lines BL and BL#. This case corresponds to a case wherein a memory cell M is constituted from a MOS transistor and a capacitor which are connected in series and a cell plate voltage is applied to a terminal of the capacitor, as shown in FIG. 23. The present invention, however, is not limited to the case, and can be applied to a case wherein a memory cell is connected to both of a pair of bit lines BL and BL# (U.S. Pat. No. 4,792,922), as shown in FIGS. 24 and 25.

Figure 13:
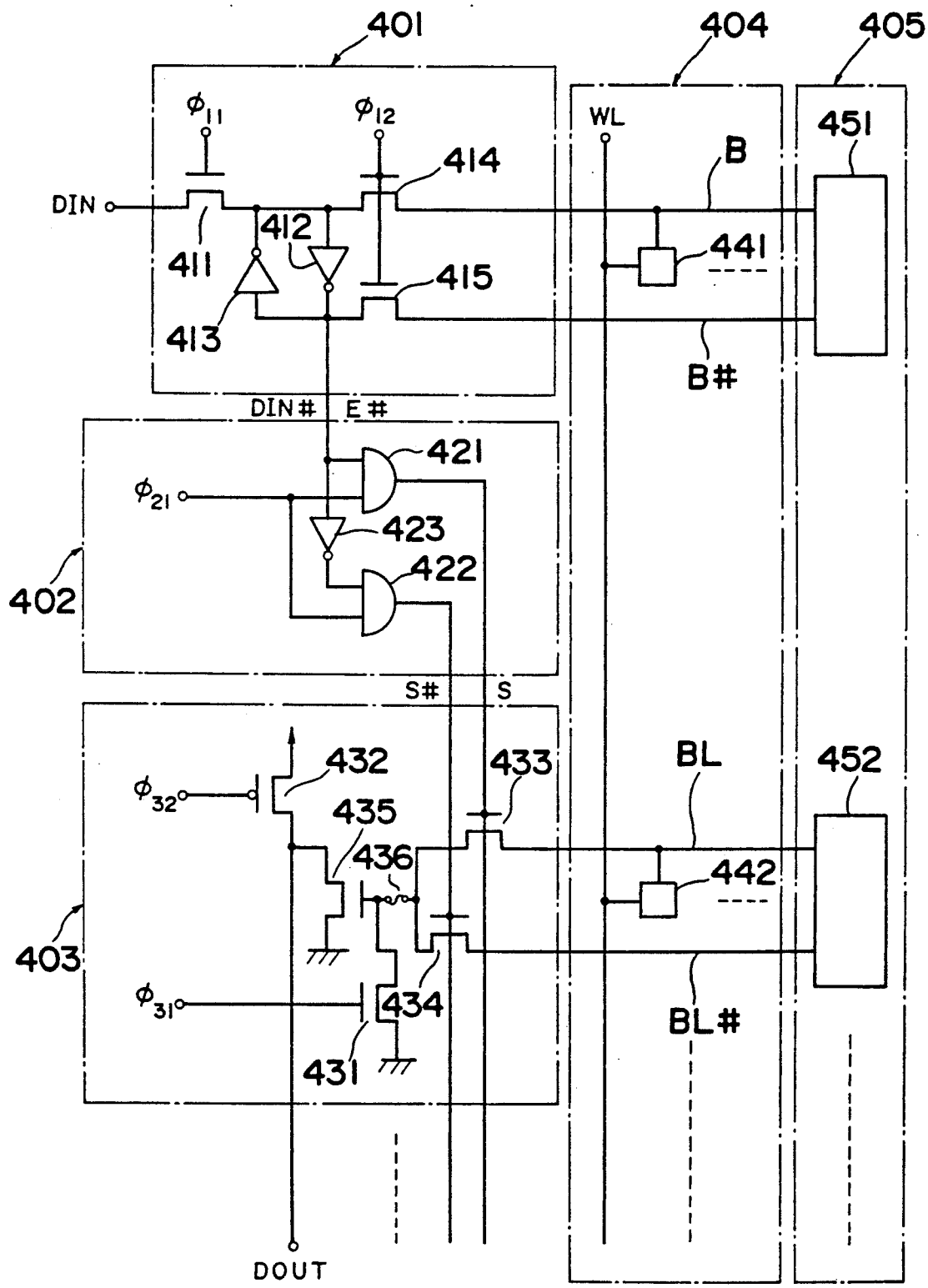
FIG. 13 is a modification of the semiconductor memory device of FIG. 12.
Figure 14:
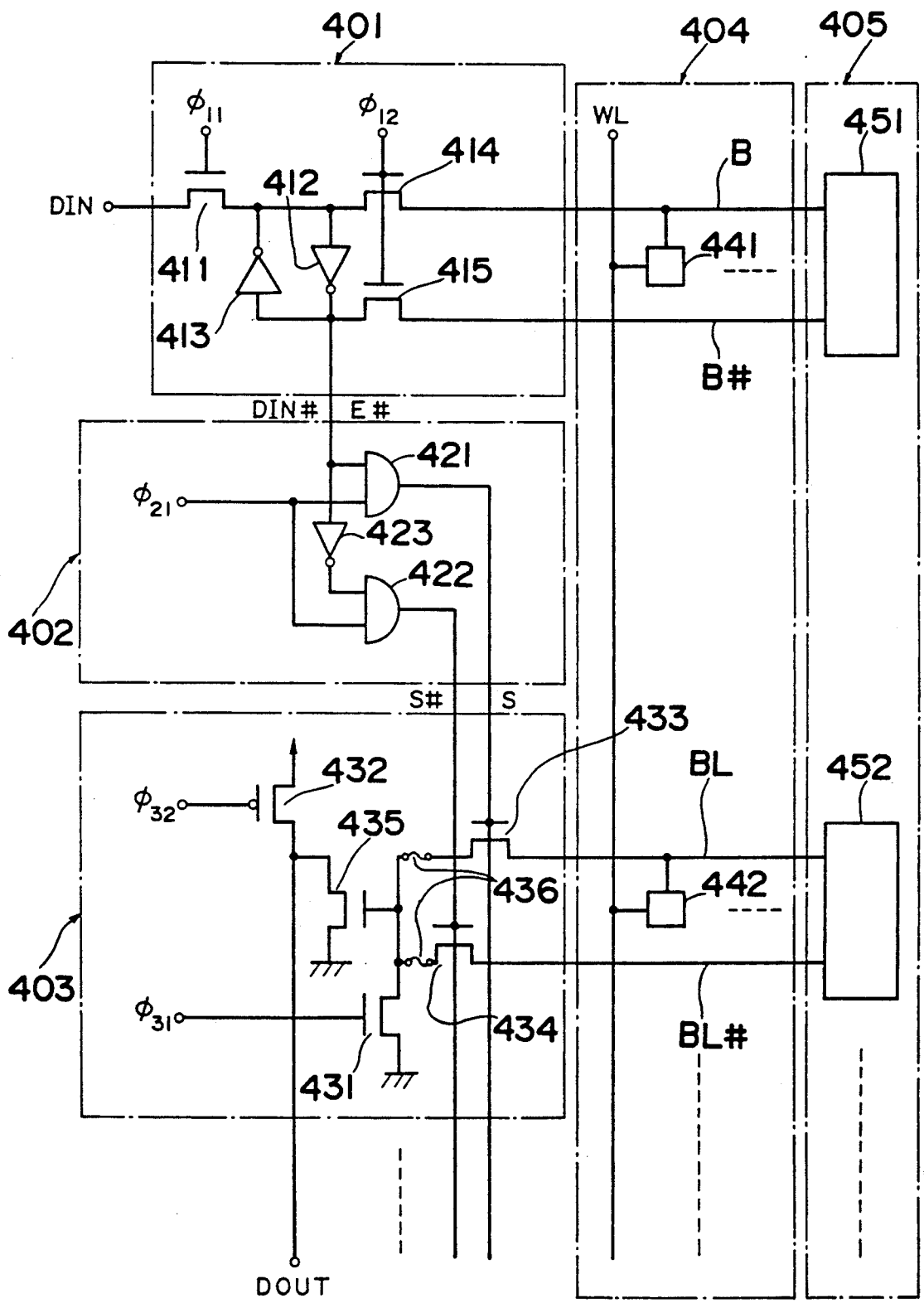
FIG. 14 is also a modification of the semiconductor memory device of FIG. 12.

The fuse 436 is connected between the NMOS transistor 435 and the output line DOUT in the above embodiment. However, the fuse 436 may be provided in positions as shown in FIGS. 13 and 14. DRAMs in the FIGS. 13 and 14 are the same in structure as the DRAM in FIG. 12, except for the connection position of the fuse 436.

The fuse 436 of FIG. 13 is connected at one end with the gate electrode of the NMOS transistor 435 and at the other end with a junction of the bit lines BL and BL#. The DRAM of FIG. 14 uses two fuses 436. One fuse 436 is provided between the gate electrode of the NMOS transistor 435 and the NMOS transistor 433 while the other fuse 436 is provided between the gate electrode of the NMOS transistor 435 and the NMOS transistor 434. The important thing is that the fuse or fuses 436 are provided so that a pair of bit lines BL and BL# is separated from the output line DOUT.

Fifth Embodiment

Figure 15:
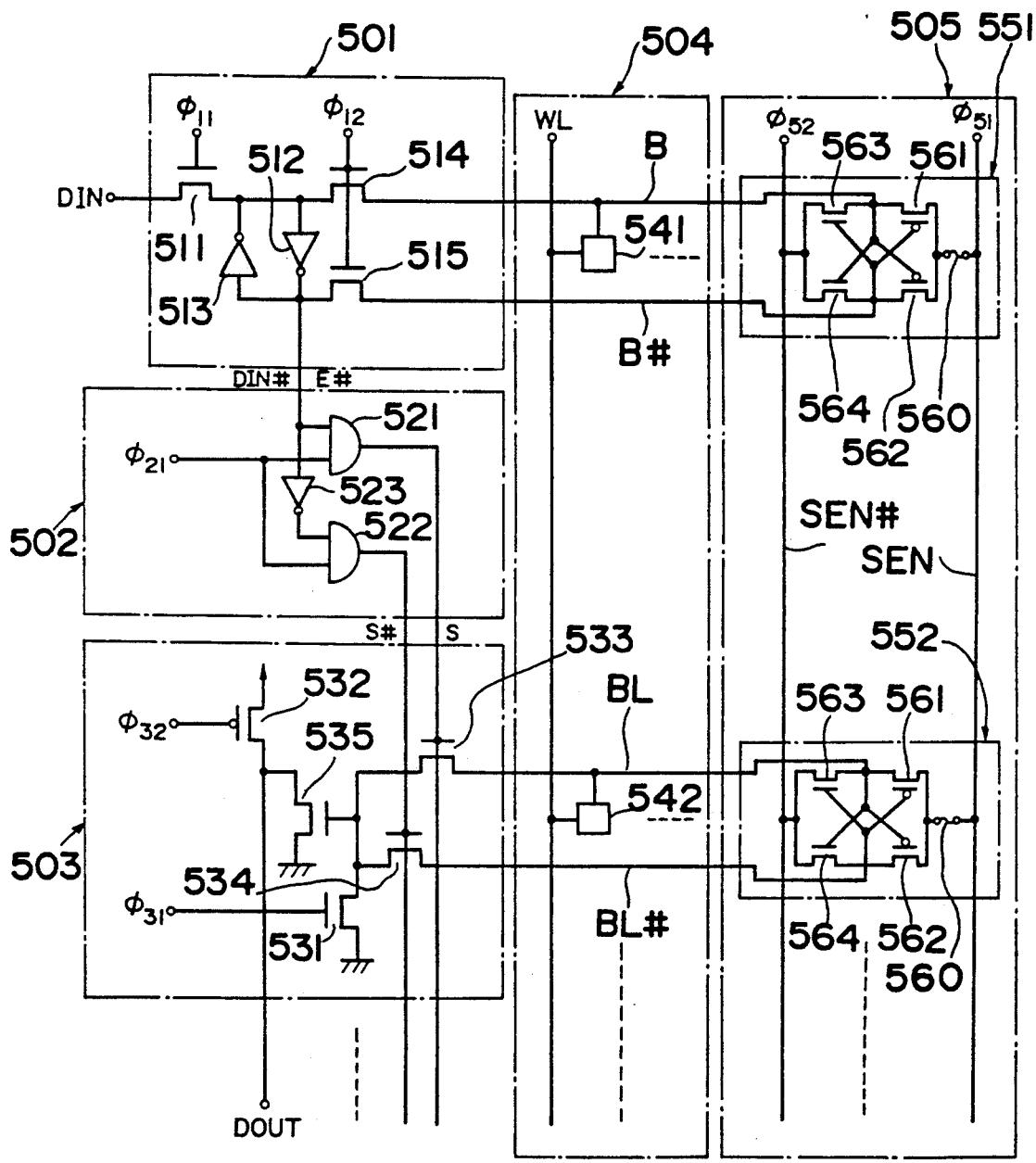
FIG. 15 is a circuit diagram of a DRAM according to a fifth embodiment of a semiconductor memory device of the present invention.

FIG. 15 shows a DRAM according to a fourth embodiment of the present invention. The DRAM has a line data storage circuit 501, a bit line select circuit 502 and a plurality of output evaluation circuits 503 (only one is shown in the figure). A reference numeral 504 indicates a memory cell array including a plurality of memory cells 541, 542, 542, ... though only two of the memory cells 541, 542 are shown in the figure. A reference numeral 505 indicates a sense amplifier array including a plurality of sense amplifiers 551, 552, 552, ... though only two of the sense amplifiers 551, 552 are shown in the figure. The memory cells 541, 542, 542, ... in each row are connected to word lines WL and are selected simultaneously by the respective word lines WL (only one of the word lines WL is shown in FIG. 15 for the sake of simplification). The memory cell 541 on each word line is a reference memory cell specialized for a line test, namely, data in the memory cell 541 is used as reference data for comparison with data read from the examined memory cells 542.

Data writing to and data reading from the reference memory cell 541 are carried out through a pair of complementary bit lines B and B# while data writing to and reading from the examined memory cells 542 are carried out by the other pairs of complementary bit lines BL and BL# (only one pair BL and BL# is shown in the figure). Actually, only the bit lines B and BL are connected to the memory cells 541 and 542, respectively.

The sense amplifier array 505 has a pair of drive signal lines SEN and SEN# for driving the sense amplifiers 551, 552, 552, . . . Each sense amplifier 551, 552 has a pair of pull-up transistors 561 and 562 and a pair of pull-down transistors 563 and 564. Furthermore, each sense amplifier has a fuse 560 which is provided between one drive signal line SEN and a junction between the pull-up transistors 561 and 562. Each sense amplifier 551, 552 acts in response to signals $\phi51$ and $\phi52$ through the drive signal lines SEN and SEN#. Specifically, when the signal $\phi51$ is raised to a power source level and the signal $\phi52$ is dropped to a ground level, the potential difference between the bit lines B and B# and that between the bit lines BL and BL# are amplified by the operation of the pull-up transistors 561 and 562 and the pull-down transistors 563 and 564.

The line data storage circuit 501 has an NMOS transistor 511 controlled by a signal $\phi11$, inverters 512 and 513 connected in parallel but in opposite directions, NMOS transistors 514 and 515 which are simultaneously controlled by a signal $\phi12$. The line data storage circuit 501 writes data, which is an input signal DIN, to the reference memory cell 541 through the bit lines B and B#. On the other hand, data DIN#, which is obtained by inverting the input signal DIN, is outputted from the line data storage circuit 501 to the bit line select circuit 502. Data written to the memory cell 541 is read out as an expected value signal E. After inverted, the signal E is outputted to the bit line select circuit 502 as signal E#.

The bit line select circuit 502 has AND gates 521 and 522 to receive a signal $\phi21$, and an inverter 523 connected between respective input terminals of the AND gates 521 and 522. In response to the inverted signal DIN# or the inverted expected value signal E# from the line data storage circuit 501, the bit line select circuit 502 outputs a pair of select signals S and S# for selecting the bit lines BL or BL# of the memory cells 542 in accordance with the level of the signal DIN# or E#.

Each output evaluation circuit 503 has an NMOS transistor 535 connected between an output line DOUT and the ground, and NMOS transistors 533 and 534 respectively provided on the bit lines BL and BL#. A gate electrode of the NMOS transistor 535 is connected with the complementary bit lines BL and BL# through the NMOS transistors 533, 534, respectively. The NMOS transistors 533 and 534 are respectively controlled by the select signals S and S# outputted from the bit line select circuit 502. Each output evaluation circuit 503 also has an NMOS transistor 531 which is connected between the gate electrode of the NMOS transistor 535 and the ground and which is controlled by a signal $\phi31$. One of the output evaluation circuits 503 has a common PMOS transistor 532 which is connected between a power source set at a ½ Vcc level and the output line DOUT and which is controlled to be turned on or off by a signal $\phi32$.

The DRAM with the above structure acts as described below, based on the timing as shown in FIG. 22. In FIG. 22, a dotted line indicates timing for a write operation and a solid line indicates timing for a readout operation.

The following describes a write operation.

In a precharge state (a leftmost part of the timing chart in FIG. 22), every bit line B, B#, BL, BL# is charged to the ½ Vcc level. The signal $\phi21$ is at a LOW level, outputs from AND gates 521 and 522 in the bit line select circuit 502 are both at a LOW level, and accordingly, no continuity exists in the NMOS transistors 533 and 534, that is, the NMOS transistors 533 and 534 are in an off-state. At this time, the signal $\phi31$ is at a HIGH level and the signal $\phi32$ is at a LOW level. In response to the signal $\phi31$, the PMOS transistor 532 is turned on and the output line DOUT is charged to the ½ Vcc level.

When the write operation starts, the level of the input signal DIN becomes HIGH or LOW in accordance with an input data. Then, the signal $\phi11$ rises, so that the NMOS transistor 511 in the line data storage circuit 501 is turned on. As a result, the input signal DIN is latched by the inverters 512 and 513. After that, the signal $\phi21$ rises. At this time, if the input signal DIN is at a HIGH level, that is, the inverted signal DIN# is at a LOW level, the voltage level of the select signal S becomes LOW and that of the other select signal S# becomes HIGH. As a result, the NMOS transistor 534 is turned on, so that the bit line BL# drops to a ground (GND) level. On the other hand, because the NMOS transistor 533 is in an off-state, the bit line BL remains at the initial level of the pre-charge state.

When the signal $\phi21$ rises, if the input signal DIN is at a LOW level, that is, the inverted signal DIN# is at a HIGH level, the voltage levels of the select signals S and S# become HIGH and LOW, respectively. Accordingly, the NMOS transistor 533 is turned on and the bit line BL drops to the GND level. On the other hand, because the NMOS transistor 534 is in an off-state, the bit line BL# keeps the initial level of the pre-charge state.

In parallel with the above operation in connection with the examined memory cell 542, the following operation is carried out in connection with the reference memory cell 541.

The signal $\phi12$ rises. In response to the rise of the signal $\phi12$, the NMOS transistors 514 and 515 in the line data storage circuit 501 are turned on, so that the input data is written to the bit lines B and B#. It is to be noted that when the input signal DIN is at a HIGH level, the bit lines B and B# become HIGH and LOW, respectively, and that when the input signal DIN is at a LOW level, the bit lines B and B# become LOW and HIGH, respectively. When a word line WL rises, the sense amplifiers 551 and 552 in the sense amplifier array 505 are driven by the signals $\phi51$ and $\phi52$ to amplify the pairs of the bit lines B and B#, and BL and BL# to a level enough to be written to the memory cells 541 and 542. Finally, the word line WL falls to finish the write operation to the memory cells 541 and 542. In the above manner, the same data is written to the memory cells 541, 542, 542 . . . at the same time through the respective pairs of bit lines B and B#, and BL and BL#.

The following describes a read operation and an output evaluation operation.

When a readout operation starts, a word line WL rises as shown in FIG. 22, and the sense amplifiers 551 and 552 are driven by the signals φ51 and φ52, so that data in the memory cells 541 and 542 are read out to the respective pairs of bit lines B and B#, and BL and BL#. Then, the signal φ12 rises. In response to this signal φ12, the expected value signal E representing data written to the reference memory cell 541 is outputted to the bit line select circuit 502 in the form of an inverted signal E#. For starting a evaluation operation, the signal φ31 falls to a LOW level, the signal φ32 rises to a HIGH level, and after that, the signal φ21 rises.

If the input data written to the reference memory cell 541 is a logical one ("1"), the expected value signal E becomes HIGH and therefore its inverted signal E# becomes LOW. At this time, the select signals S and S# become LOW and HIGH, respectively. Accordingly, the NMOS transistor 534 in the output evaluation circuit 503 is turned on, and thereby a signal at the level of the bit line BL# is inputted to the gate electrode of the NMOS transistor 535. If the read operation from the examined memory cell 542 is normally carried out, the bit line BL# must be at a LOW level. When the bit line BL# is at a LOW level, the gate electrode of the NMOS transistor 535 is provided with a LOW-level signal, so that the NMOS transistor 535 keeps its off-state. As a result, a signal of the ½ Vcc level indicative of "coincidence" is outputted to the output line DOUT. On the other hand, if the data read from the examined memory cell 542 results in error, the bit line BL# is at a HIGH level. In this case, the NMOS transistor 535 is turned on and a ground-level signal representative of "non-coincidence" is outputted to the output line DOUT.

When data written to the reference memory cell 541 is a logical zero ("0"), the expected value signal E becomes LOW and therefore its inverted signal E# becomes HIGH. At this time, the select signals S and S# become HIGH and LOW, respectively. Accordingly, the NMOS transistor 533 in the output evaluation circuit 503 is turned on, and thereby a signal at the level of the bit line BL is inputted to the gate electrode of the NMOS transistor 535. If the data reading from the examined memory cell 542 is normally executed, the bit line BL must be at a LOW level. When the bit line BL is at a LOW level, the gate electrode of the NMOS transistor 535 is provided with a signal of a LOW level, so that the NMOS transistor 535 keeps its off-state. As a result, a signal of the ½ Vcc level indicative of "coincidence" is outputted to the output line DOUT. On the other hand, if the data read from the examined memory cell 542 results in error, the bit line BL is at a HIGH level. In this case, the NMOS transistor 535 is turned on and a ground-level signal representative of "non-coincidence" is outputted to the output line DOUT.

As described above, whether the data written to the memory cells 541 and 542 at the same time are a logical zero or one, the DRAM outputs a signal indicative of "coincidence" when the data is normally read out from the examined memory cell 542, and outputs a signal indicative of "non-coincidence" when the data is erroneously read out from the examined memory cell 542.

The above read and evaluation operation is executed simultaneously for all the examined memory cells 42 storing data equivalent to a line data, independently of each other. Therefore, the operating test of the device can be performed at a high speed.

Besides, when the reading of data from some examined memory cell 542, for example, among the memory cells 542 for one-line data fails, the DRAM can prohibit the corresponding sense amplifier 552 from further operating by cutting the fuse 560 of the sense amplifier 552 having amplified the data in the defective memory cell 542. In this case, even after a sense operation has been done, it does not occur that the levels of defective bit lines BL and BL# will exceed the initial level (½ Vcc level) of the precharge state. At this time, because the power source is set at the ½ Vcc level, a drain voltage of the NMOS transistor 535 is equal to or below ½ Vcc. That is, both a gate voltage and the drain voltage are equal to or below the ½ Vcc level. Therefore, the NMOS transistor 535 will not be turned on in any case. In other words, the defective bit lines BL and BL# are electrically separated from the output line DOUT all the time. Therefore, even though the DRAM has defective bit lines BL, BL#, the DRAM can perform a read operation and an output evaluation operation without being affected by the defective bit lines.

In the present embodiment, the memory cell 541 is connected with only one B of the bit lines B and B# and the memory cells 542 with only one BL of the bit lines BL and BL#. This case corresponds to a case wherein a memory cell M is constituted from a MOS transistor and a capacitor which are connected in series and a cell plate voltage is applied to one of terminals of the capacitor, as shown in FIG. 23. The present invention, however, is not limited to the case, and can be applied to a case wherein a memory cell is connected to both of a pair of bit lines BL and BL# (U.S. Pat. No. 4,792,922), as shown in FIGS. 24 and 25.

Sixth Embodiment

Figure 16:
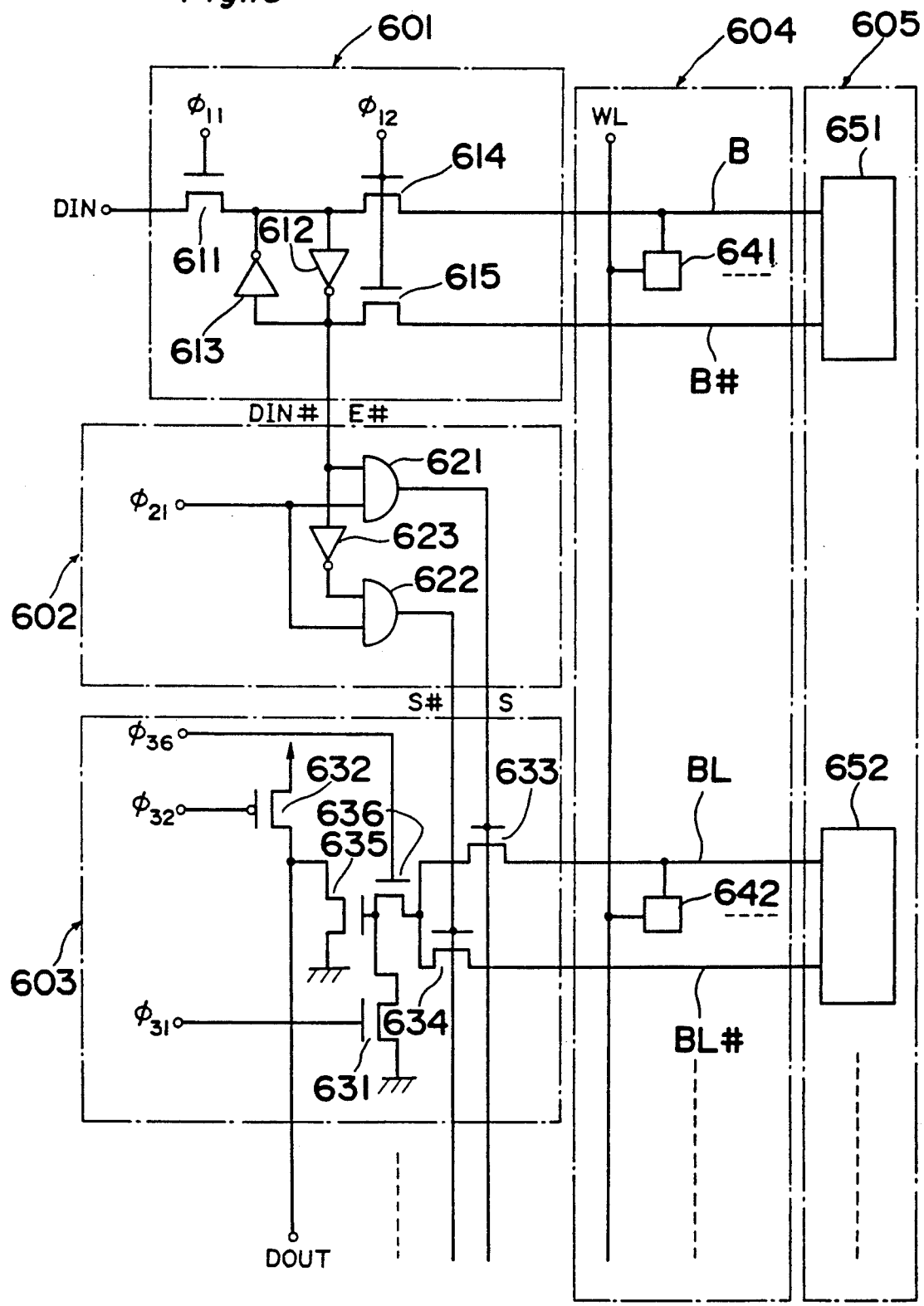
FIG. 16 is a circuit diagram of a DRAM according to a sixth embodiment of the present invention.
Figure 17:
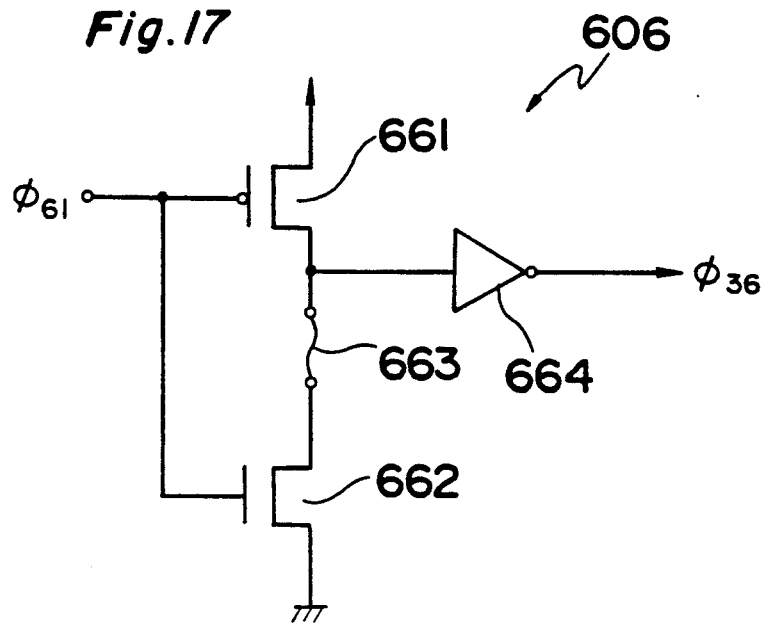
FIG. 17 is a circuit diagram of a control circuit incorporated in the DRAM of FIG. 16.

FIGS. 16 and 17 show a DRAM according to a sixth embodiment of the present invention. The DRAM has a line data storage circuit 601, a bit line select circuit 602, a plurality of output evaluation circuits 603 (only one is shown in the figure), a memory cell array 604, and a sense amplifier array 605. The DRAM also has a plurality of control circuits 606 as described in detail later and as shown in FIG. 17. The memory cell array includes a plurality of memory cells 641, 642, 642, ... though only two of the memory cells 641, 642 are shown in the figure. The sense amplifier array includes a plurality of sense amplifiers 651, 652, 652, ... though only two of the sense amplifiers 651, 652 are shown in the figure. The memory cells 641, 642, 642, ... in each row are connected to word lines WL and are selected simultaneously by the respective word lines WL (only one of the word lines WL is shown in FIG. 16 for the sake of simplification). The memory cell 641 on each word line WL is a reference memory cell specialized for a line test, namely, data in the reference memory cell 641 is used as reference data for comparison with data read from the other memory cells 642 as examined memory cells. Data writing to and data reading from the reference memory cell 641 are carried out through a pair of complementary bit lines B and B# while data writing to and reading from each of the examined memory cells 642 are carried out by a pair of complementary bit lines BL and BL#. Actually, only the bit lines B and BL are connected to the memory cells 641 and 642, respectively, similarly to the above embodiments.

The sense amplifiers 651 and 652 of the sense amplifier array 605 are driven by drive signal lines (not shown) so as to amplify the potential difference between the bit lines B and B# and that between the bit lines BL and BL#, respectively. Unlike the sense amplifiers 551 and 552 of the fifth embodiment shown in FIG. 15, the sense amplifiers 651 and 652 do not have a fuse.

The line data storage circuit 601 has an NMOS transistor 611 controlled by a signal $\phi 11$, inverters 612 and 613 connected in parallel but in opposite directions, NMOS transistors 614 and 615 which are simultaneously controlled by a signal $\phi 12$. The line data storage circuit 601 writes data, which is an input signal DIN, to the memory cell 641 through the bit lines B and B#. On the other hand, data DIN#, which is obtained by inverting the input signal DIN, is outputted from the line data storage circuit 601 to the bit line select circuit 602. Data written to the memory cell 641 is read out as an expected value signal E. After inverted, the signal E is outputted to the bit line select circuit 602 as signal E#.

The bit line select circuit 602 has AND gates 621 and 622 to receive a signal $\phi 21$, and an inverter 623 connected between respective input terminals of the AND gates 621 and 622. In response to the inverted signal DIN# or the inverted expected value signal E# from the line data storage circuit 601, the bit line select circuit 602 outputs a pair of select signals S and S# for selecting the bit line BL or BL# of the memory cells 642 in accordance with the level of the signal DIN# or E#.

Each output evaluation circuit 603 has an NMOS transistor 635 connected between an output line DOUT and the ground, and NMOS transistors 633 and 634 provided respectively on the bit lines BL and BL#. The output evaluation circuit 603 has a further NMOS transistor 636. A gate electrode of the NMOS transistor 635 is connected with one terminal of this NMOS transistor 636. The other terminal of the NMOS transistor 636 is connected to the bit lines BL and BL# through the NMOS transistors 633 and 634. There is provided a still further NMOS transistor 631, which is connected between the gate electrode of the NMOS transistor 635 and the ground. The NMOS transistors 633 and 634 are controlled by respective select signals S and S# outputted from the bit line select circuit 602. The NMOS transistor 631 is controlled by a signal $\phi 31$. The NMOS transistor 636 is controlled by a signal $\phi 36$ outputted from a corresponding control circuit 606 shown in FIG. 17.

One of the output evaluation circuits 603 has their common PMOS transistor 632 which is connected between a power source set at a HIGH level and the output line DOUT and which is controlled to be turned on or off by a signal $\phi 32$.

Each control circuit 606 is constituted from a PMOS transistor 661, a fuse 663, an NMOS transistor 662 and an inverter 664. The PMOS transistor 661, the fuse 663 and the NMOS transistor 662 are connected in series between the power source (HIGH level) and the ground. The inverter 664 is connected to a junction between the PMOS transistor 661 and the fuse 663. The PMOS and NMOS transistors 661 and 663 are controlled by a signal $\phi 61$ which assumes a LOW level when the DRAM is in a precharge state and assumes a HIGH level when the DRAM starts its operation. In the case that the fuse 663 is not cut, the PMOS transistor 661 is in an on-state and the NMOS transistor 662 is in an off-state during the precharge state of the DRAM, so that the signal $\phi 36$ becomes LOW through the inverter 664. When the DRAM starts its operation, the PMOS transistor 661 is turned off and the NMOS transistor 662 is turned on, so that the signal $\phi 36$ becomes HIGH. On the other hand, in the case that the fuse 663 is cut, the signal $\phi 36$ is kept at a LOW level all the time. Accordingly, the NMOS transistor 636 shown in FIG. 16 is in an off state during the precharge state of the DRAM, and is turned on upon the start of the operation, when the fuse 663 is not cut. On the other hand, if the fuse 663 is cut, the NMOS transistor 636 keeps its off state.

The DRAM with the above structure acts as described below, based on the timing as shown in FIG. 22.

The following describes a write operation.

In the precharge state (a leftmost part of the timing chart in FIG. 22), every bit line B, B#, BL, BL# is charged to the $\frac{1}{2}$ Vcc level. The signal $\phi 21$ is at a LOW level, outputs from AND gates 621 and 622 in the bit line select circuit 602 are both at a LOW level, and accordingly, no continuity exists in the NMOS transistors 633 and 634, that is, the NMOS transistors 633 and 634 are in an off-state. At this time, the signal $\phi 31$ is at a HIGH level and the signal $\phi 32$ is at a LOW level. In response to the signal $\phi 32$, the PMOS transistor 632 is turned on and the output line DOUT is charged to a HIGH level. In addition, the signal $\phi 36$ is at a LOW level and therefore the NMOS transistor 636 is in an off state.

When the write operation starts, the level of the input signal DIN becomes HIGH or LOW in accordance with an input data. Then, the signal $\phi 11$ rises, so that the NMOS transistor 611 in the line data storage circuit 601 is turned on. As a result, the input signal DIN is latched by the inverters 612 and 613. After that, the signal $\phi 21$ rises. At this time, if the input signal DIN is at a HIGH level, that is, the inverted signal DIN# is LOW, the level of the select signal S becomes LOW and that of the other select signal S# becomes HIGH. As a result, the NMOS transistor 634 is turned on, so that the bit line BL# is caused to drop to a ground (GND) level through the NMOS transistor 636 turned on in response to the signal $\phi 36$ of a HIGH level and the NMOS transistor 631 having been turned on since the precharge state. On the other hand, because the NMOS transistor 633 is in an off-state, the bit line BL remains at the initial level of the precharge state.

When the signal $\phi 21$ rises, if the input signal DIN is at a LOW level, that is, the inverted signal DIN# is at a HIGH level, the voltage levels of the select signals S and S# become HIGH and LOW, respectively. Accordingly, the NMOS transistor 633 is turned on and the bit line BL drops to the GND level. On the other hand, because the NMOS transistor 634 is in an off-state, the bit line BL# keeps the initial level of the precharge state.

In parallel with the above operation in connection with the examined memory cell 642, the following operation is carried out in connection with the reference memory cell 641.

The signal $\phi 12$ rises. In response to the rise of the signal $\phi 12$, the NMOS transistors 614 and 615 in the line data storage circuit 601 are turned on, so that the input data is written to the bit lines B and B#. It is to be noted that when the input signal DIN is at a HIGH level, the bit lines B and B# become HIGH and LOW, respectively, and that when the input signal DIN is at a LOW level, the bit lines B and B# become LOW and HIGH, respectively. When the word line WL rises, the sense amplifiers 651 and 652 in the sense amplifier array 605 are driven and to amplify the pairs of the bit lines B and B#, and BL and BL# to a level enough to be written to the memory cells 641 and 642. Finally, the word line WL falls to finish the write operation to the memory cells 641 and 642. In the above manner, the same data is written to the memory cells 641, 642, 642, ... at the same time through the respective pairs of bit lines B and B#, and BL and BL#.

The following describes a read operation and an output evaluation operation.

When a read operation starts, a word line WL rises as shown in FIG. 22, and the sense amplifiers 651 and 652 are driven, so that data in the memory cells 641, 642, 642, ... are read out to the respective pairs of bit lines B and B#, and BL and BL#. Then, the signal $\phi 12$ rises. In response to this signal $\phi 12$, the expected value signal E representing data written to the reference memory cell 641 is outputted to the bit line select circuit 602 in the form of an inverted signal E#. For starting a evaluation operation, the signal $\phi 31$ falls to a LOW level, the signal $\phi 32$ rises to a HIGH level, and after that, the signal $\phi 21$ rises.

If the input data written to the reference memory cell 641 is a logical one ("1"), the expected value signal E becomes HIGH and therefore its inverted signal E# becomes LOW. At this time, the select signals S and S# become LOW and HIGH, respectively. Accordingly, in each output evaluation circuit 603, the NMOS transistor 634 is turned on, and thereby a signal at the level of the bit line BL# is inputted to the gate electrode of the NMOS transistor 635 through the NMOS transistor 636 in an on-state. If the data reading from an examined memory cell 642 is normally carried out, the bit line BL# must be at a LOW level. When the bit line BL# is at a LOW level, the gate electrode of the NMOS transistor 635 is provided with a LOW-level signal, so that the NMOS transistor 635 keeps its off-state. As a result, a signal of a HIGH level indicative of "coincidence" is outputted to the output line DOUT. On the other hand, if the data reading from the memory cell 642 results in error, the bit line BL# is at a HIGH level. In this case, the NMOS transistor 635 is turned on and a LOW-level signal representative of "non-coincidence" is outputted to the output line DOUT.

When data written to the reference memory cell 641 is a logical zero ("0"), the expected value signal E becomes a LOW level and therefore its inverted signal E# becomes a HIGH level. At this time, the select signals S and S# become HIGH and LOW, respectively. Accordingly, in each output evaluation circuit 603, the NMOS transistor 633 is turned on, and thereby a signal at the level of the bit line BL is inputted to the gate electrode of the NMOS transistor 635 through the NMOS transistor 636 in an on state. If the data reading from the examined memory cell 642 is normally carried out, the bit line BL must be at a LOW level. When the bit line BL is at a LOW level, the gate electrode of the NMOS transistor 635 is provided with a signal of a LOW level, so that the NMOS transistor 635 keeps its off-state. As a result, a HIGH-level signal indicative of "coincidence" is outputted to the output line DOUT. On the other hand, if the data reading from the memory cell 642 results in error, the bit line BL is at a HIGH level. In this case, the NMOS transistor 635 is turned on and a LOW-level signal representative of "non-coincidence" is outputted to the output line DOUT.

As described above, whether the data written to the memory cells 641 and 642 at the same time are a logical zero or one, the DRAM outputs a signal indicative of "coincidence" when the data is normally read out from the examined memory cell 642, and outputs a signal indicative of "non-coincidence" when the data is erroneously read out from the examined memory cell 642.

The above read and evaluation operation is executed simultaneously for all the examined memory cells 42 storing data equivalent to a line data, independently of each other. Therefore, the operating test of the device can be performed at a high speed.

Besides, when the read of data from some memory cell 642, for example, among the memory cells 642 fails, the NMOS transistor 635 for transferring the signal from the memory cell 642 to the output line DOUT can be kept in an off state all the time. More specifically, by cutting the fuse 663 in the corresponding control circuit 606, shown in FIG. 17, for controlling the NMOS transistor 636, the NMOS transistor 636 can be kept in an off state all the time so as for the NMOS transistor 635 not to be turned on. Accordingly, the defective bit lines can be separated from the output line DOUT. Therefore, even when the DRAM has defective bit lines, the read-out operation and the evaluation operation can be well performed without being affected by the defective bit lines.

Figure 18:
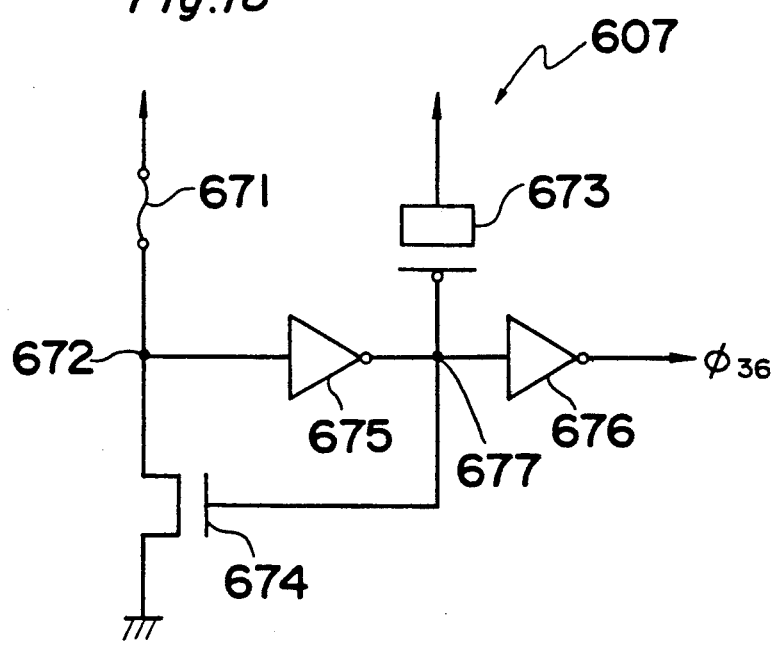
FIG. 18 is a modification of the control circuit of FIG. 17.

Alternatively, the DRAM may have control circuits 607 as shown in FIG. 18, in stead of the control circuits 606. The control circuit 607 has a fuse 671 and an NMOS transistor 674 which are connected in series between the power source (HIGH level) and the ground. The control circuit 607 also has a PMOS capacitor 673 connected between the power source (HIGH level) and a gate electrode of the NMOS transistor 674. An inverter 675 is connected between a conjunction 672 between the fuse 671 and the NMOS transistor 674 and a conjunction 677 between the PMOS capacitor 673 and the gate electrode of the NMOS transistor 674. Another inverter 676 is connected with the conjunction 677.

The fuse 671 of this control circuit 607 is cut only when the corresponding bit lines BL, BL# in the DRAM are defective, similarly to the fuse 661 of the control circuit 606 shown in FIG. 17. If the fuse 671 is not cut, a level at the conjunction 672 becomes HIGH after the power is supplied, and the signal $\phi 36$ level becomes HIGH through the inverters 675 and 676. As a result, the NMOS transistor 636 shown in FIG. 16 is turned on and kept in an on-state all the time. If the fuse 671 is cut, the NMOS transistor 636 remains in an off state after the power is supplied. Accordingly, the DRAM having the control circuits 607 can well perform the read operation and the evaluation operation without being affected by defective bit lines, if any.

In the present embodiment, the memory cell 641 is connected with only one B of the bit lines B and B# and the memory cell 642 with only one BL of the bit lines BL and BL#. The present invention, however, is not limited to this, and can be applied to a case wherein a memory cell M is connected to both of a pair of bit lines BL and BL# (U.S. Pat. No. 4,792,922), as shown in FIGS. 24 and 25.

Seventh Embodiment

Figure 19:
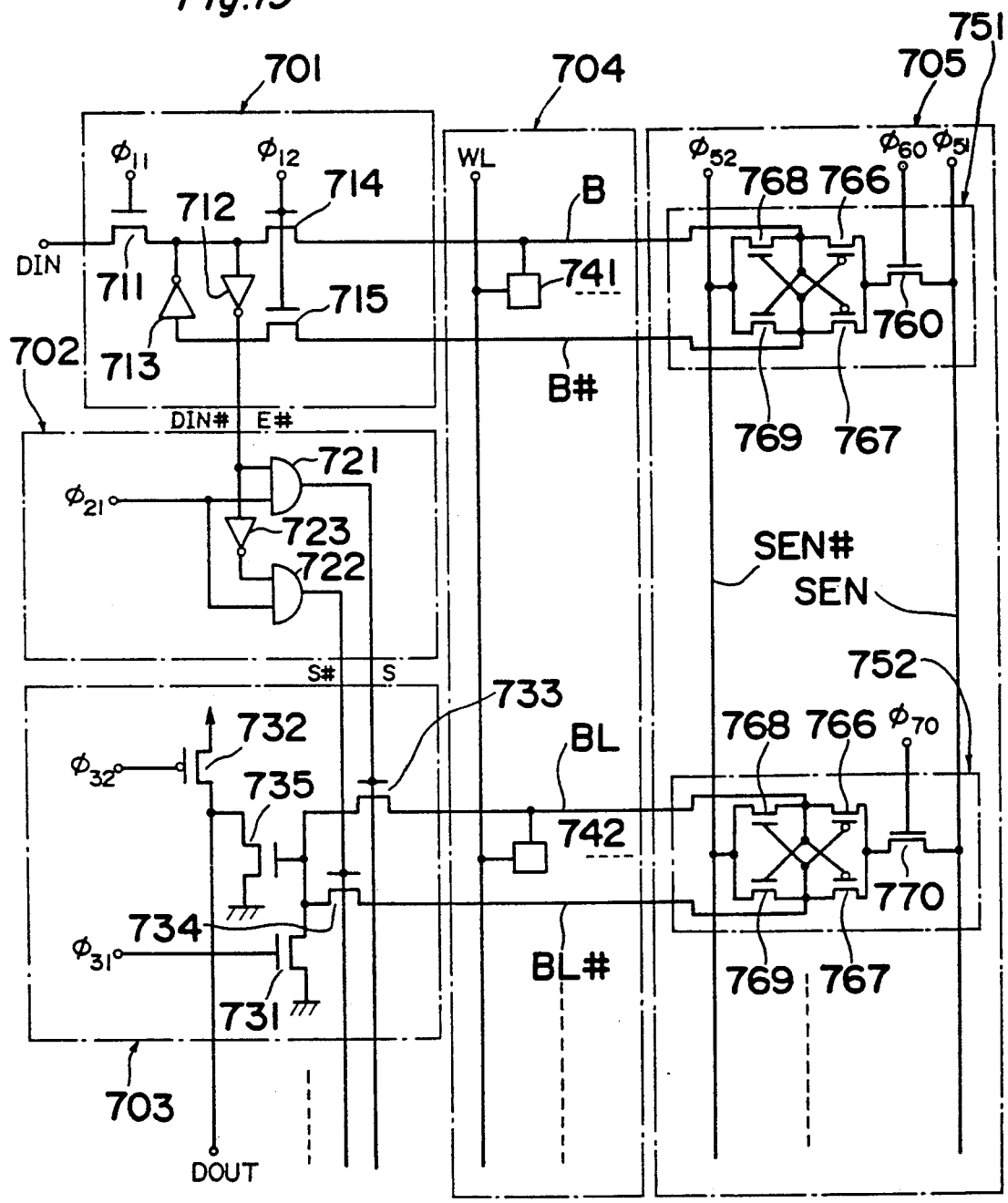
FIG. 19 is a circuit diagram of DRAM according to a seventh embodiment of the present invention.

FIG. 19 shows a DRAM according to a seventh embodiment of the present invention. The DRAM has a line data storage circuit 701, a bit line select circuit 702 and a plurality of output evaluation circuits 703 (only one is shown in the figure). A reference numeral 704 indicates a memory cell array including a plurality of memory cells 741, 742, 742, ... though only one of the memory cells 742 is shown in the figure. A reference numeral 705 indicates a sense amplifier array including a plurality of sense amplifiers 751, 752, 752, ... though only one of the sense amplifiers 752 is shown in the figure. The memory cells 741, 742, 742, ... in each row are connected to word lines WL and are selected simultaneously by the respective word lines WL (only one of the word lines WL is shown in FIG. 19 for the sake of simplification). The memory cell 741 on each word line is a reference memory cell specialized for a line test, namely, data in the memory cell 741 is used as reference data for comparison with data read from the other memory cells 742 as examined memory cells.

Data writing to and data reading from the memory cell 741 are carried out through a pair of complementary bit lines B and B# while data write to and read from the other memory cells 742 are carried out by the other pairs of complementary bit lines BL and BL# (only one pair BL and BL# is shown in the figure). Actually, only the bit lines B and BL are connected to the memory cells 741 and 742, respectively.

The sense amplifier array 705 has a pair of drive signal lines SEN and SEN# for driving the sense amplifiers 751, 752, 752, ... Each sense amplifier 751, 752 has a pair of pull-up transistors 766 and 767 and a pair of pull-down transistors 768 and 769. Furthermore, each sense amplifier has an NMOS transistor 760, 770 which is provided between one drive signal line SEN and a junction between the pull-up transistors 766 and 767. The sense amplifiers 751, 752 act in response to signals $\phi 51$ and $\phi 52$ through the drive signal line SEN, the NMOS transistor 760, 770, and the drive signal line SEN#. Specifically, when the signal $\phi 51$ rises to a power source level and the signal $\phi 52$ falls to a ground level, the potential difference between the bit lines B and B# and that of the bit lines BL and BL# are amplified by the operation of the pull-up transistors 766 and 767 and the pull-down transistors 768 and 769. The NMOS transistors 760, 770 are controlled by their respective signals $\phi 60$ and $\phi 70$ outputted from the control circuits 706 shown in FIG. 20.

Each control circuit 706 is constituted from a PMOS transistor 761, a fuse 763, an NMOS transistor 762 and an inverter 764. The PMOS transistor 761, the fuse 763 and the NMOS transistor 762 are connected in series between the power source (HIGH level) and the ground. The inverter 764 is connected to a junction between the PMOS transistor 761 and the fuse 763. The PMOS and NMOS transistors 761 and 763 are controlled by a signal $\phi 61$ which assumes a LOW level when the DRAM is in a precharge state and assumes a HIGH level when the DRAM starts its operation. In the case that the fuse 763 is not cut, the PMOS transistor 761 is in an on-state and the NMOS transistor 762 is in an off-state during the precharge state of the DRAM, so that the signal $\phi 60$, $\phi 70$ become LOW through the inverter 764. When the DRAM starts its operation, the PMOS transistor 761 is turned off and the NMOS transistor 762 is turned on in each control circuit 706, so that the signals $\phi 60$, $\phi 70$ become HIGH. On the other hand, in the case that the fuse 763 is cut, the signals $\phi 60$, $\phi 70$ are kept at a LOW level all the time. Accordingly, the NMOS transistors 760, 770 shown in FIG. 19 are in an off state during the precharge state of the DRAM, and are turned on upon the start of the operation, while the fuses 763 are not cut. On the other hand, if the fuse 763 in a control circuit 706 is cut, the NMOS transistor 760 or 770 keeps its off state.

The line data storage circuit 701 has an NMOS transistor 711 controlled by a signal $\phi 11$, inverters 712 and 713 connected in parallel but in opposite directions, NMOS transistors 714 and 715 which are simultaneously controlled by a signal $\phi 12$. The line data storage circuit 701 writes data, which is an input signal DIN, to the memory cell 741 through the bit lines B and B#. On the other hand, data DIN#, which is obtained by inverting the input signal DIN, is outputted from the line data storage circuit 701 to the bit line select circuit 702. Data written to the memory cell 741 is read out as an expected value signal E. After inverted, the signal E is outputted to the bit line select circuit 702 as signal E#.

The bit line select circuit 702 has AND gates 721 and 722 to receive a signal $\phi 21$, and an inverter 723 connected between respective input terminals of the AND gates 721 and 722. In response to the inverted signal DIN# or the inverted expected value signal E# from the line data storage circuit 701, the bit line select circuit 702 outputs a pair of select signals S and S# for selecting the bit line BL or BL# of each memory cell 742 in accordance with the level of the signal DIN# or E#.

Each output evaluation circuit 703 has an NMOS transistor 735 connected between an output line DOUT and the ground, and NMOS transistors 733 and 734 respectively provided on the bit lines BL and BL#. A gate electrode of the NMOS transistor 735 is connected with the complementary bit lines BL and BL# through the NMOS transistors 733, 734, respectively. The NMOS transistors 733 and 734 are respectively controlled by the select signals S and S# outputted from the bit line select circuit 702. Each output evaluation circuit 703 also has an NMOS transistor 731 which is connected between the gate electrode of the NMOS transistor 735 and the ground and which is controlled by a signal $\phi 31$. One of the output evaluation circuits 703 has a common PMOS transistor 732 which is connected between a power source set at a ½ Vcc level and the output line DOUT and which is controlled to be turned on or off by a signal $\phi 32$.

The DRAM with the above structure acts as described below, based on the timing as shown in FIG. 22. In FIG. 22, a dotted line indicates timing for a write operation and a solid line indicates timing for a read operation.

The DRAM with the above structure acts as described below, based on the timing as shown in FIG. 22, similarly to the aforementioned embodiments.

The following describes a write operation.

In a precharge state (a leftmost part of the timing chart in FIG. 22), every bit line B, B#, BL, BL# is charged to the ½ Vcc level. The signal $\phi 21$ is at a LOW level, outputs from AND gates 721 and 722 in the bit line select circuit 702 are both at a LOW level, and accordingly, no continuity exists in the NMOS transistors 733 and 734, that is, the NMOS transistors 733 and 734 are in an off-state. At this time, the signal $\phi 31$ is at a HIGH level and the signal $\phi 32$ is at a LOW level. In response to the signal $\phi 31$, the PMOS transistor 732 is turned on and the output line DOUT is charged to the ½ Vcc level.

When the write operation starts, the level of the input signal DIN becomes HIGH or LOW in accordance with an input data. Then, the signal $\phi 11$ rises, so that the NMOS transistor 711 in the line data storage circuit 701 is turned on. As a result, the input signal DIN is latched by the inverters 712 and 713. After that, the signal $\phi 21$ rises. At this time, if the input signal DIN is at a HIGH level, that is, the inverted signal DIN# is at a LOW level, the level of the select signal S becomes LOW and that of the other select signal S# becomes HIGH. As a result, the NMOS transistor 734 in each output evaluation circuit 703 is turned on, so that the bit lines BL# are dropped to a ground (GND) level. On the other hand, because the NMOS transistor 733 in each output evaluation circuit 703 is in an off-state, the other bit lines BL remain at the initial level of the pre-charge state.

When the signal $\phi 21$ rises, if the input signal DIN is at a LOW level, that is, the inverted signal DIN# is at a HIGH level, the voltage levels of the select signals S and S# become HIGH and LOW, respectively. Accordingly, in each output evaluation circuit 703, the NMOS transistor 733 is turned on and the bit line BL drops to the GND level. On the other hand, because the NMOS transistor 734 is in an off-state, the bit line BL# keeps the initial level of the precharge state.

In parallel with the above operation in connection with the memory cells 742, the following operation is carried out in connection with the reference memory cell 741.

The signal $\phi 12$ rises. In response to the rise of the signal $\phi 12$, the NMOS transistors 714 and 767 in the line data storage circuit 701 are turned on, so that the input data is written to the bit lines B and B#. It is to be noted that when the input signal DIN is at a HIGH level, the bit lines B and B# become HIGH and LOW, respectively, and that when the input signal DIN is at a LOW level, the bit lines B and B# become LOW and HIGH, respectively. When a word line WL rises, the sense amplifiers 751 and 752 in the sense amplifier array 705 are driven by the signals $\phi 51$ and $\phi 52$ to amplify the pairs of the bit lines B and B#, and BL and BL# to a level enough to be written to the memory cells 741 and 742. Finally, the word line WL falls to finish the write operation to the memory cells 741 and 742. In the above manner, the same data is written to the memory cells 741, 742, . . . at the same time through the respective pairs of bit lines B and B#, and BL and BL#.

The following describes a read operation and an output evaluation operation.

When a read operation starts, a word line WL rises as shown in FIG. 22, and the sense amplifiers 751, 752, 752 . . . are driven by the signals $\phi 51$ and $\phi 52$, so that data in the memory cells 741 and 742 are read out to the respective pairs of bit lines B and B#, and BL and BL#. Then, the signal $\phi 12$ rises. In response to this signal $\phi 12$, the expected value signal E representing data written to the memory cell 741 is outputted to the bit line select circuit 702 in the form of an inverted signal E#. For starting a evaluation operation, the signal $\phi 31$ is dropped to a LOW level, the signal $\phi 32$ is raised to a HIGH level, and after that, the signal $\phi 21$ is raised.

If the input data written to the reference memory cell 741 is a logical one ("1"), the expected value signal E becomes HIGH and therefore its inverted signal E# becomes LOW. At this time, the select signals S and S# become LOW and HIGH, respectively. Accordingly, the NMOS transistor 734 in each output evaluation circuit 703 is turned on, and thereby a signal at the level of the bit line BL# is inputted to the gate electrode of the NMOS transistor 735. If the data reading from the memory cell 742 is normally carried out, the bit line BL# should be at a LOW level. When the bit line BL# is at a LOW level, the gate electrode of the NMOS transistor 735 is provided with a LOW-level signal, so that the NMOS transistor 735 keeps its off-state. As a result, a signal of the $\frac{1}{2}$ Vcc level indicative of "coincidence" is outputted to the output line DOUT. On the other hand, if the data reading from the memory cell 742 results in error, the bit line BL# is at a HIGH level. In this case, the NMOS transistor 735 is turned on and a ground-level signal representative of "non-coincidence" is outputted to the output line DOUT.

When data written to the reference memory cell 741 is a logical zero ("0"), the expected value signal E becomes a LOW level and therefore its inverted signal E# becomes HIGH. At this time, the select signals S and S# become HIGH and LOW, respectively. Accordingly, the NMOS transistor 733 in the output evaluation circuit 703 is turned on, and thereby a signal at the level of the bit line BL is inputted to the gate electrode of the NMOS transistor 735. If the data reading from a memory cell 742 is normally carried out, the bit line BL should be at a LOW level. When the bit line BL is LOW, the gate electrode of the NMOS transistor 735 is provided with a signal of a LOW level, so that the NMOS transistor 735 keeps its off-state. As a result, a signal of the $\frac{1}{2}$ Vcc level indicative of "coincidence" is outputted to the output line DOUT. On the other hand, if the data reading from a memory cell 742 results in error, its bit line BL is at a HIGH level. In this case, the NMOS transistor 735 is turned on and a ground-level signal representative of "non-coincidence" is outputted to the output line DOUT.

As described above, whether the data written to the memory cells 741 and 742 at the same time are a logical zero or one, the DRAM outputs a signal indicative of "coincidence" when the data is normally read out from a memory cell 742, and outputs a signal indicative of "non-coincidence" when the data is erroneously read out from the memory cell 742.

The above read and evaluation operation is executed simultaneously for all the memory cells 742 storing data equivalent to a line data, independently of each other. Therefore, the operating test of the device can be performed at a high speed.

Figure 20:
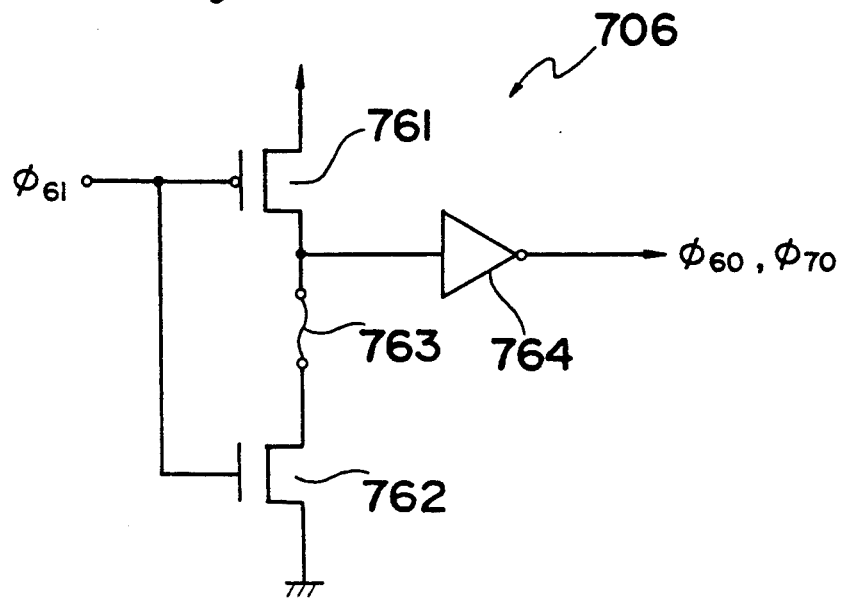
FIG. 20 is a circuit diagram of a control circuit incorporated in the DRAM of FIG. 19.

Besides, when the reading of data from some memory cell 742 fails, the DRAM can prohibit the corresponding sense amplifier 752 from further operating by cutting the fuse 763 of its control circuit 706 in FIG. 20 and thereby turning off the NMOS transistor 770 of the sense amplifier 752 having amplified the data in the memory cell 742. In this case, even after a sense operation has been done, it does not occur that the levels of defective bit lines BL and BL# will exceed the initial level ($\frac{1}{2}$ Vcc level) of the precharge state. At this time, because the source of the PMOS transistor 732 common to the output evaluation circuits 703 is set at the $\frac{1}{2}$ Vcc level, a drain voltage of the NMOS transistor 735 is equal to or below $\frac{1}{2}$ Vcc. That is, both the gate voltage and the drain voltage are equal to or below the $\frac{1}{2}$ Vcc level. Therefore, the NMOS transistor 735 will not be turned on in any case. In other words, the defective bit lines BL and BL# are electrically separated from the output line DOUT all the time. Therefore, even though the DRAM has defective bit lines BL, BL#, the DRAM can perform a read operation and an output evaluation operation without being affected by the defective bit lines.

Figure 21:
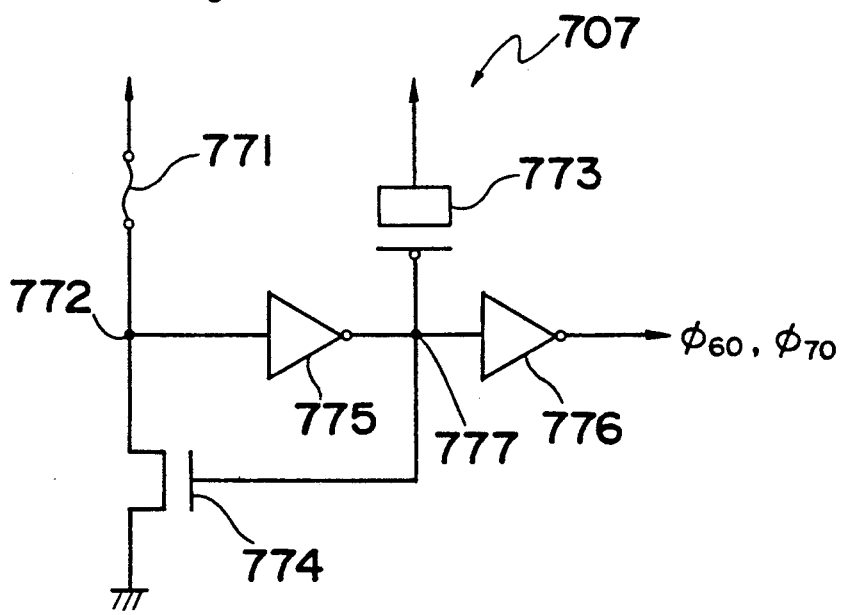
FIG. 21 is a modification of a control circuit in the DRAM of FIG. 19.

Alternatively, the DRAM may have control circuits 707 as shown in FIG. 21, in stead of the control circuits 706. The control circuits 707 each have a fuse 771 and an NMOS transistor 774 which are connected in series between the power source (HIGH level) and the ground. The control circuits 707 each also have a PMOS capacitor 773 connected between the power source (HIGH level) and a gate electrode of the NMOS transistor 774. An inverter 775 is connected between a conjunction 772 between the fuse 771 and the NMOS transistor 774 and a conjunction 777 between the PMOS capacitor 773 and the gate electrode of the NMOS transistor 774. Another inverter 776 is connected with the conjunction 777.

The fuse 771 of each control circuit 707 is cut only when the corresponding bit lines in the DRAM are poor, similarly to the fuse 761 of the control circuit 706 shown in FIG. 20. If the fuse 771 is not cut, a level at the conjunction 772 becomes HIGH after the power is supplied, and the signal φ36 level becomes HIGH through the inverters 775 and 776. As a result, the NMOS transistors 760, 770 shown in FIG. 19 are turned on and kept in an on-state all the time. If the fuse 771 in a control circuit 703 is cut, a corresponding NMOS transistor 760 or 770 remains in an off state after the power is supplied. Accordingly, the DRAM having the control circuits 707 can well perform the read operation and the evaluation operation without being affected by defective bit lines, if any.

In the present embodiment, the memory cell 741 is connected with only one B of the bit lines B and B# and each of the memory cells 742 with only one BL of the bit lines BL and BL#. This case corresponds to a case wherein a memory cell M is constituted from a MOS transistor and a capacitor which are connected in series and a cell plate voltage is applied to one of terminals of the capacitor, as shown in FIG. 23. The present invention, however, is not limited to the case, and can be applied to a case wherein a memory cell is connected to both of a pair of bit lines BL and BL# (U.S. Pat. No. 4,792,922), as shown in FIGS. 24 and 25.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device having a function of testing its own operation through a parallel access to memory cells, comprising:
   a plurality of examined memory cells for storing data to be tested in a test mode of the device, said plurality of examined memory cells being arranged in rows and columns;
   a plurality of reference memory cells in a column for storing expected data in the test mode;
   a plurality of word lines which are connected with the examined memory cells in respective rows and respective ones of said plurality of reference memory cells;
   a plurality of pairs of bit lines operating complementarily, connected with the examined memory cells in respective columns;
   a pair of bit lines operating complementarily, connected with said plurality of reference memory cells in a single column;
   a plurality of sense amplifiers connected with respective pairs of bit lines connected with the examined memory cells and the reference memory cells for amplifying data on the bit lines before the data are outputted;
   a line data memory circuit for outputting the expected data written to a reference memory cell via the pair of bit lines connected to the reference memory cell;
   a bit line select circuit for selecting, in response to the expected data, one of the bit lines for each of the examined memory cells when the expected data is of a low level, and selecting the other of the bit lines when the expected data is of a high level;
   a plurality of output evaluation circuits connected with respective ones of the pairs of bit lines for the examined memory cells, each output evaluation circuit detecting via the one bit line selected by the bit line select circuit when the expected data is of a low level, an output signal from the corresponding examined memory cell which expresses data having been written to the examined memory cell in parallel to the reference memory cell and which ought to have a value identical with the expected data; and detecting the output signal via the other bit line selected by the bit line select circuit when the expected data is of a high level; and outputting a signal indicative of coincidence or non-coincidence between the output signal detected and the expected data.

2. A semiconductor memory device as claimed in claim 1, wherein each output evaluation circuit has a fuse for separating the pair of bit lines connected with the output evaluation circuit from the output terminal of the output evaluation circuit when the output evaluation circuit outputs a signal expressing the non-coincidence.

3. A semiconductor memory device as claimed in claim 1, wherein a fuse is provided between each sense amplifier and a drive signal line for transferring a drive signal for the sense amplifiers to allow the sense amplifier to be inoperative when the fuse is cut.

4. A semiconductor memory device as claimed in claim 1, wherein the output evaluation circuits each have a transistor controlled to be turned on or off by a corresponding one of a plurality of control circuits so as for the corresponding pair of bit lines to be electrically connected with or separated from an output terminal of the output evaluation circuit, said control circuits are operatively connected with the output evaluation circuits respectively such that the control circuits turn on the transistors when the output evaluation circuits output the signal indicative of coincidence and turn off the transistors when the output evaluation circuits output the signal indicative of non-coincidence, the transistor of each output evaluation circuit being controlled individually and independently of the transistors of the other output evaluation circuits.

5. The semiconductor memory device as claimed in claim 4, wherein the control circuit has a fuse which is cut when the output evaluation circuit outputs the signal indicative of non-coincidence.

6. The semiconductor memory device as claimed in claim 1, wherein the sense amplifiers each have a transistor controlled to be turned on or off by a corresponding one of a plurality of control circuits so as for the sense amplifiers to be electrically connected with or separated from a drive signal line carrying a signal for driving the sense amplifiers, said control circuits are operatively connected with the output evaluation circuits respectively such that the control circuits turn on the transistors when the output evaluation circuits output the signal indicative of coincidence and turn off the transistors when the output evaluation circuits output the signal indicative of non-coincidence, the transistor of each sense amplifier being controlled individually and independently of the transistors of the other sense amplifiers.

7. The semiconductor memory device as claimed in claim 6, wherein the control circuit has a fuse which is cut when the output evaluation circuit outputs the signal indicative of non-coincidence.

8. The semiconductor memory device as claimed in claim 1, which outputs a pass signal only when all the output evaluation circuits output the signal indicative of coincidence, and outputs a fail signal when all the output evaluation circuits do not output the signal indicative of coincidence.

9. The semiconductor memory device as claimed in claim 8, further comprising:
- a row address counter for receiving a count input signal in response to a line test signal for instructing to start a test of the device to count a row address to be tested and output the counted row address deciding a word line to a row decoder;
- an input terminal for inputting a plurality of test patterns from an external source;
- a latch circuit for latching the test patterns inputted from the input terminal in response to the line test signal; and
- a pattern control circuit for selecting in response to an address data outputted by the row address counter one of the test patterns latched by the latch circuit and outputting the selected test pattern to the line data storage circuit as input data to be written to the reference memory cells and the examined memory cells.

10. A test circuit for a semiconductor memory device comprising:
- a means for generating an expected value of either high or low level;
- an output signal line for temporarily holding the expected value;
- a fail signal line for constantly holding a level in reverse phase to the output signal line;
- a first data line carrying a first data signal of a level which should be identical to that of the expected value;
- a second data line carrying a second data signal which is a complementary signal of the first data signal;
- a data signal select circuit for, in response to the expected value from the generating means, generating a data select signal designating either the first data signal or the second data signal based on the expected value;
- a first switch for selecting and outputting one of the complementary first and second data signals in response to the data select signal generated by the data signal select circuit;
- a second switch provided between the output signal line and the fail signal line so that in response to an output signal from the first switch the second switch electrically connects the output signal line with or separates the output signal line from the fail signal line in accordance with a level of the output signal;

wherein whenever the level of the first data signal is coincident with the level of the expected value, the output signal from the first switch allows the second switch to separate the output signal line from the fail signal line so that the output signal line outputs the expected value temporarily held by the output signal line, and whenever the level of the first data signal is not coincident with the level of the expected value, the output signal from the first switch causes the second switch to connect the output signal line with the fail signal line so that the output signal line outputs the level held by the fail signal line.

11. The test circuit as claimed in claim 10, wherein the first switch includes a first n-channel metal oxide semiconductor transistor provided on the first data line and a second n-channel metal oxide semiconductor transistor provided on the second data line, with respective gate electrodes of the first and second transistors being connected with complementarily operating output terminal of the data select circuit, the first transistor is turned on when the expected value is low so that the first switch outputs the first data signal on the first data line, the second transistor is turned on when the expected value is high so that the first switch outputs the second data signal on the second data line, thereby the level of the output signal from the first switch is low when the expected value and the first data signal are coincident, the second switch consists of a third n-channel metal oxide semiconductor transistor with a gate electrode of the third n-channel metal oxide semiconductor transistor being connected with the output from the first switch so that when the output signal of a low level is received from the first switch, the third transistor is turned off.

* * * * *